United States Patent
Yamamoto

(10) Patent No.: US 10,541,163 B2
(45) Date of Patent: Jan. 21, 2020

(54) SUBSTRATE PROCESSING METHOD AND SUBSTRATE PROCESSING APPARATUS

(71) Applicant: SCREEN Holdings Co., Ltd., Kyoto (JP)

(72) Inventor: Masahiro Yamamoto, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 0 days.

(21) Appl. No.: 15/109,576

(22) PCT Filed: Jan. 7, 2015

(86) PCT No.: PCT/JP2015/050246
§ 371 (c)(1),
(2) Date: Jul. 1, 2016

(87) PCT Pub. No.: WO2015/107955
PCT Pub. Date: Jul. 23, 2015

(65) Prior Publication Data
US 2016/0329224 A1 Nov. 10, 2016

(30) Foreign Application Priority Data
Jan. 20, 2014 (JP) .................................. 2014-007398

(51) Int. Cl.
*H01L 21/67* (2006.01)
*B08B 1/00* (2006.01)
(Continued)

(52) U.S. Cl.
CPC ........ *H01L 21/67276* (2013.01); *B08B 1/002* (2013.01); *B08B 3/04* (2013.01);
(Continued)

(58) Field of Classification Search
CPC .... G05B 19/41865; G05B 2219/32258; G05B 2219/32272; G05B 2219/45031; C23C 16/52
(Continued)

(56) References Cited

U.S. PATENT DOCUMENTS

| 5,867,389 A * | 2/1999 | Hamada | G05B 19/41865 257/E21.525 |
| 7,308,329 B2 * | 12/2007 | Ikeno | G05B 19/41865 700/100 |

(Continued)

FOREIGN PATENT DOCUMENTS

| JP | 8-037156 | 2/1996 |
| JP | 2003-203833 | 7/2003 |

(Continued)

OTHER PUBLICATIONS

International Search Report dated Apr. 7, 2015 in corresponding PCT International Application No. PCT/JP2015/050246.

(Continued)

*Primary Examiner* — Nadine G Norton
*Assistant Examiner* — Christopher Remavege
(74) *Attorney, Agent, or Firm* — Ostrolenk Faber LLP

(57) ABSTRACT

A technique to prevent reduction in throughput of a substrate processing apparatus. On the occurrence of an event disabling execution of a recipe by a processing unit, a different recipe executed by this processing unit may be used depending on the type of event having occurred. The type of event to occur and a substitute recipe that can take the place of a recipe being executed are associated in advance. On the occurrence of abnormality, it is determined whether or not a recipe being executed can be substituted by a different recipe. If the recipe can be substituted, it is determined whether or not the substitute recipe is contained in an (Continued)

| ID(SS1-1-V2) | |
|---|---|
| VARIABLE V2 (CHAMBER LIFE:THE NUMBER OF PROCESSED SUBSTRATES) | CHANGED UNIT RECIPE |
| 100 | UNIT RECIPE 1 |
| 300 | UNIT RECIPE 2001 |
| 400 | PREPARATORY PROCESS FIRST AND THEN UNIT RECIPE 1 | unfinished job. If these conditions are satisfied, a substrate processing schedule is changed to execute the substitute recipe in this processing unit. If these conditions are not satisfied, substrate process in this processing unit is stopped.

11 Claims, 22 Drawing Sheets

(51) Int. Cl.
    *B08B 3/04*     (2006.01)
    *B08B 9/093*     (2006.01)
    *H01L 21/02*     (2006.01)
    *H01L 21/687*     (2006.01)

(52) U.S. Cl.
    CPC ........ *B08B 9/093* (2013.01); *H01L 21/02057* (2013.01); *H01L 21/67051* (2013.01); *H01L 21/68707* (2013.01)

(58) Field of Classification Search
    USPC ........ 118/697; 134/18; 438/5, 758; 700/121, 700/90
    See application file for complete search history.

(56) References Cited

U.S. PATENT DOCUMENTS

| | | | | |
|---|---|---|---|---|
| 9,389,601 | B2* | 7/2016 | Nakamura | G05B 15/02 |
| 2003/0138551 | A1* | 7/2003 | Miyata | H01L 21/6715 427/8 |
| 2003/0216053 | A1* | 11/2003 | Miyata | H01L 21/6715 438/758 |
| 2005/0096770 | A1* | 5/2005 | Chua | G05B 19/41865 700/102 |
| 2007/0199655 | A1* | 8/2007 | Yokouchi | H01L 21/67288 156/345.11 |
| 2009/0132078 | A1 | 5/2009 | Sakano | 700/103 |
| 2009/0326704 | A1* | 12/2009 | Chan | G05B 19/41865 700/121 |
| 2011/0172800 | A1* | 7/2011 | Koizumi | H01L 21/67253 700/100 |
| 2014/0074277 | A1* | 3/2014 | Mitsui | G06F 17/50 700/121 |
| 2014/0093984 | A1* | 4/2014 | Itou | H01L 21/67745 438/5 |
| 2014/0121791 | A1* | 5/2014 | Nakamura | G05B 15/02 700/90 |

FOREIGN PATENT DOCUMENTS

| | | |
|---|---|---|
| JP | 3773626 B2 | 2/2006 |
| JP | 2007-123734 | 5/2007 |
| JP | 2008-135517 A | 6/2008 |
| KR | 10-2002-0004732 | 1/2002 |
| KR | 10-2007-0089604 | 8/2007 |
| KR | 10-2008-0035975 A | 4/2008 |

OTHER PUBLICATIONS

International Preliminary Report on Patentability (IPRP) issued by the International Bureau of WIPO dated Aug. 4, 2016 in connection with corresponding application PCT/JP2015/050246, with English translation.
Korean Office Action for Korean Application No. 10-2016-7022571 dated Jul. 19, 2017 and its English translation based on the Japanese translation. Portions relevant to prior-art based rejections are translated.
Korean Decision to Grant a Patent dated Feb. 13, 2018.
Korean Office Action dated Dec. 27, 2017 with English translation of the Office Action based on Japanese translation. Portions relevant to prior-art based rejections are translated.

\* cited by examiner

F I G. 3
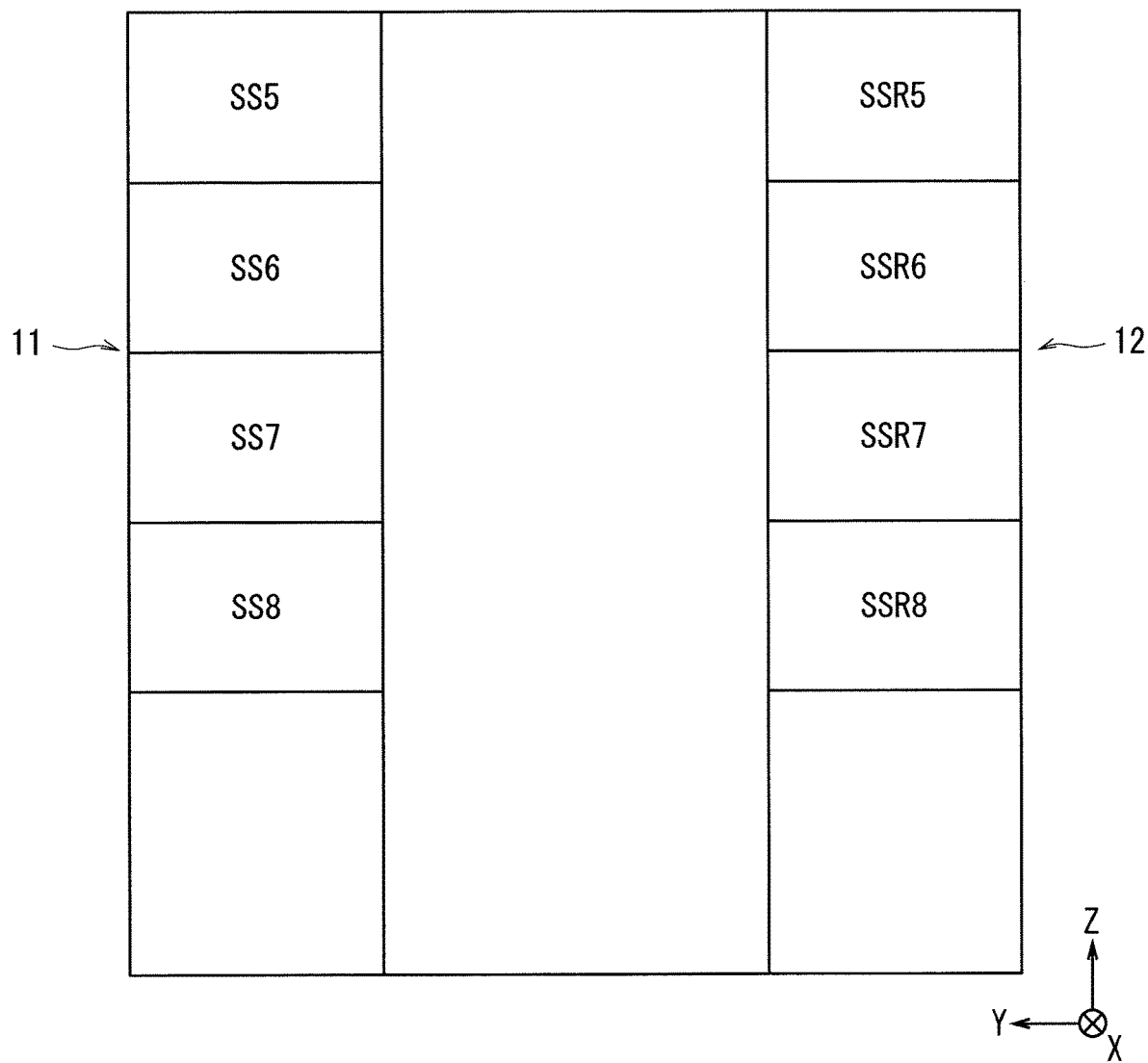

F I G. 9
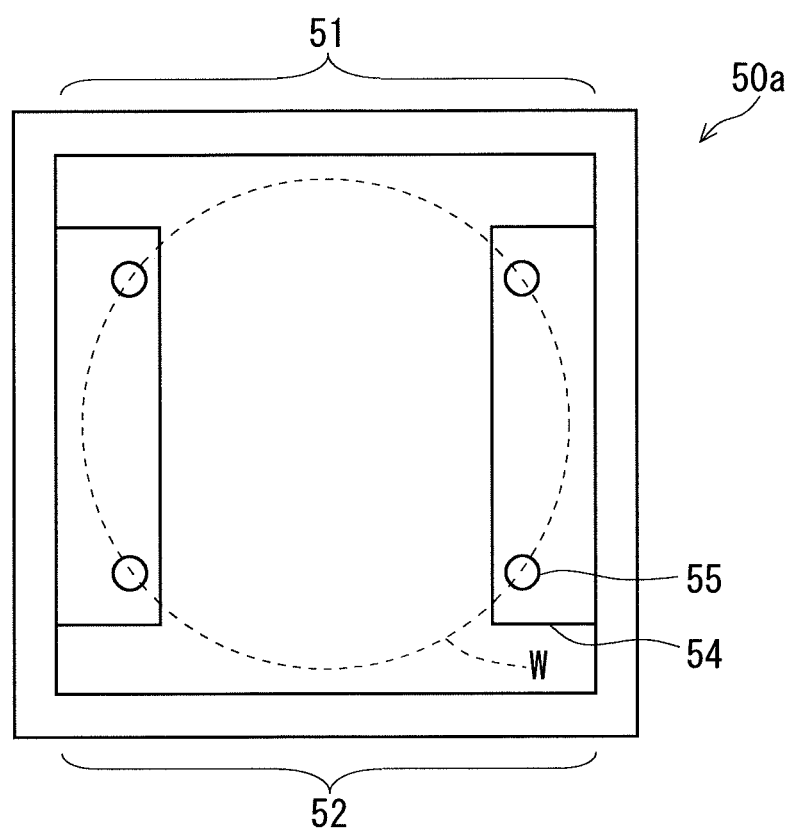

FIG. 12A
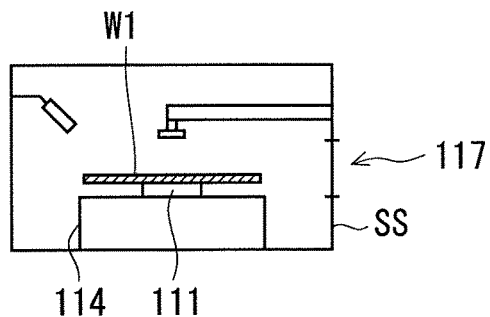 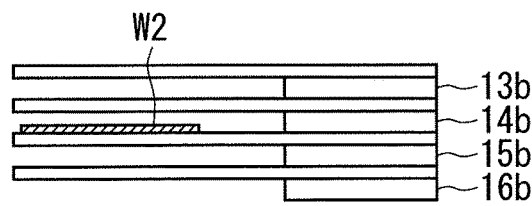
FIG. 12B
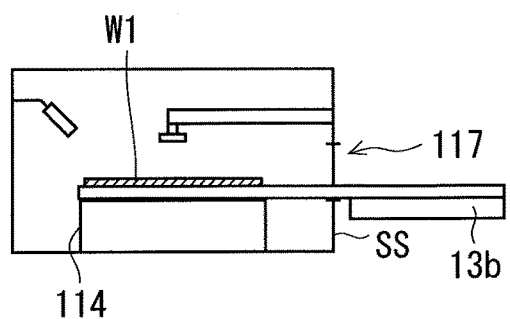 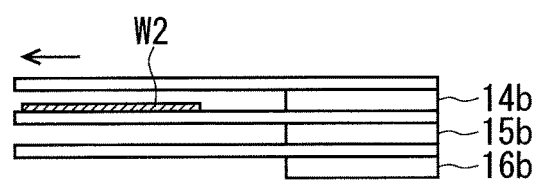
FIG. 12C
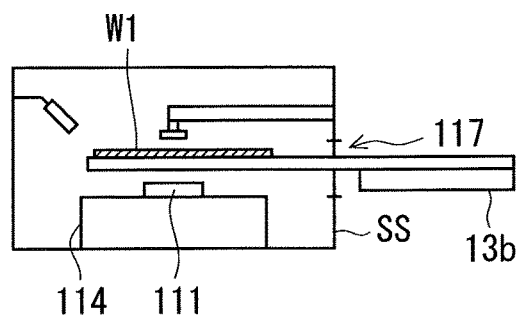 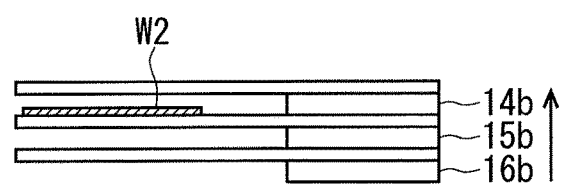
FIG. 12D
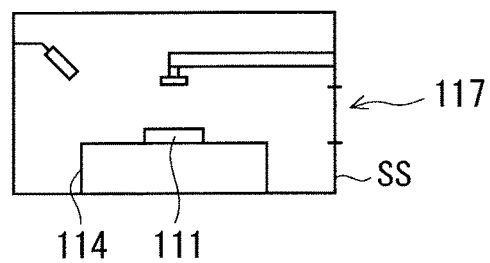 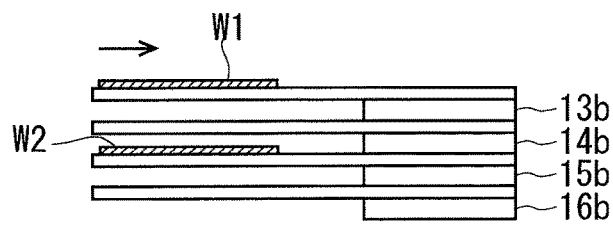

FIG. 13A
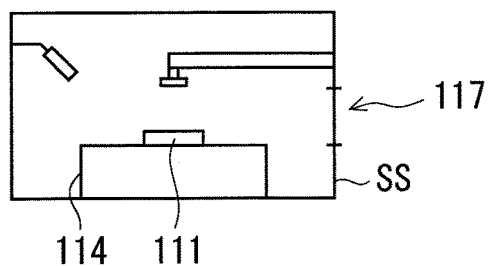 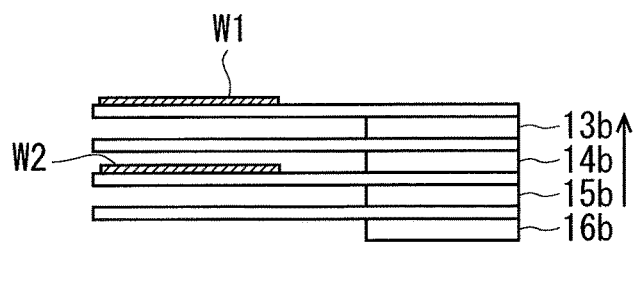
FIG. 13B
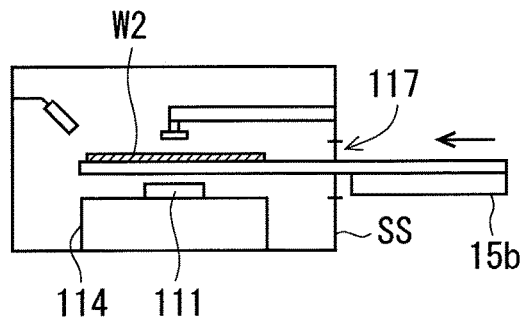 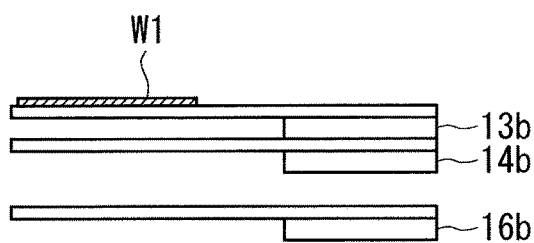
FIG. 13C
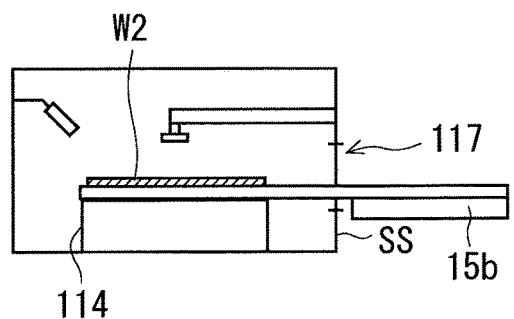 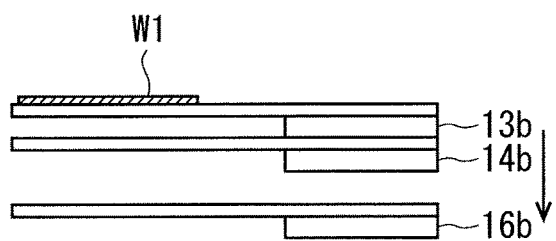
FIG. 13D
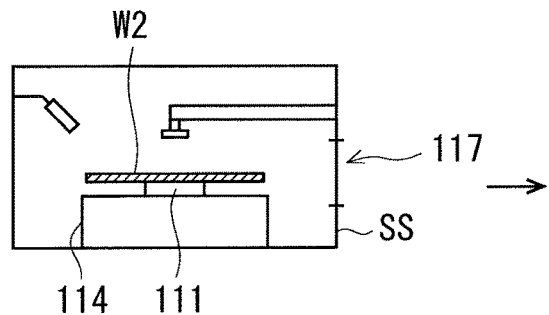 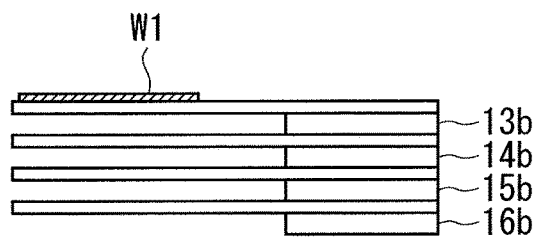

FIG. 14A
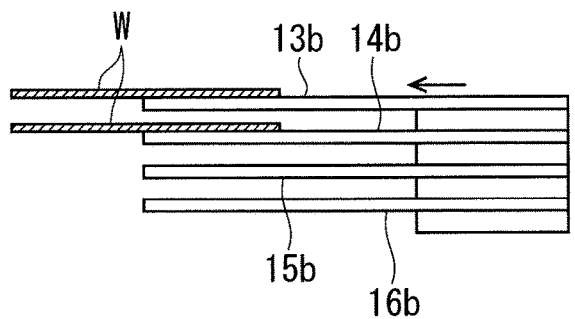
FIG. 14B
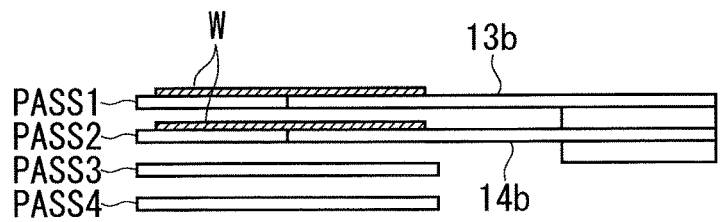
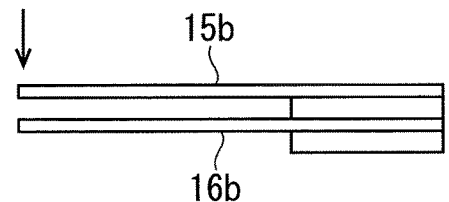
FIG. 14C
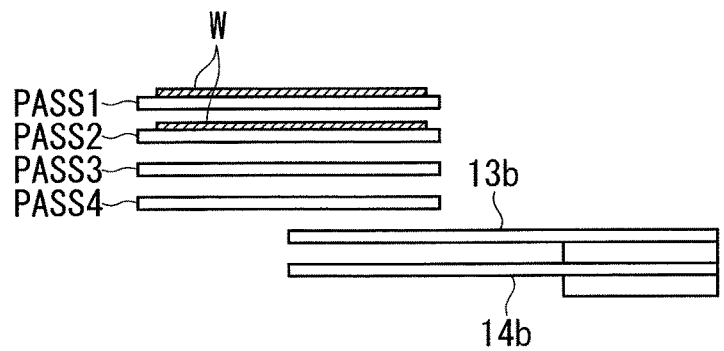
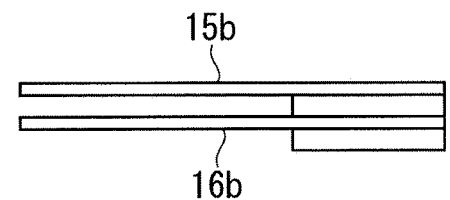

FIG. 15

| | S1 | S2 | S3 | S4 | S5 | S6 | S7 | S8 | S9 | S10 | S11 | S12 | S13 |
|---|---|---|---|---|---|---|---|---|---|---|---|---|---|
| FIRST PATTERN "CLEANING OF ONLY FRONT SURFACE" | C | IR | PASS | CR | SS (FRONT) | CR | — | — | — | — | PASS | IR | C |
| SECOND PATTERN "CLEANING OF ONLY REAR SURFACE" | C | IR | RT2 (FROM FRONT TO REAR) | CR | SSR (REAR) | CR | — | — | — | — | RT2 (FROM REAR TO FRONT) | IR | C |
| THIRD PATTERN "CLEANING OF BOTH SURFACES (REAR SURFACE FIRST AND THEN FRONT SURFACE)" | C | IR | RT2 (FROM FRONT TO REAR) | CR | SSR (REAR) | CR | RT1 (FROM REAR TO FRONT) | CR | SS (FRONT) | CR | PASS | IR | C |
| FOURTH PATTERN "CLEANING OF BOTH SURFACES (FRONT SURFACE FIRST AND THEN REAR SURFACE)" | C | IR | PASS | CR | SS (FRONT) | CR | RT1 (FROM FRONT TO REAR) | CR | SSR (REAR) | CR | RT2 (FROM REAR TO FRONT) | IR | C |

F I G. 1 6

| FLOW RECIPE FR1 | STEP | PROCESSING UNIT | UNIT RECIPE | | |
|---|---|---|---|---|---|
| | | | PREPARATORY PROCESS | SUBSTRATE PROCESS | POST-PROCESS |
| | STEP1 | SS1 | — | UNIT RECIPE 1 | — |
| | | SS2 | — | UNIT RECIPE 1 | — |

F I G. 1 7

| FLOW RECIPE FR2 | STEP | PROCESSING UNIT | UNIT RECIPE | | |
|---|---|---|---|---|---|
| | | | PREPARATORY PROCESS | SUBSTRATE PROCESS | POST-PROCESS |
| | STEP1 | SS1 | UNIT RECIPE 11 | UNIT RECIPE 2 | — |
| | | SS2 | UNIT RECIPE 11 | UNIT RECIPE 2 | — |

FIG. 19A

| ID(SS1-1-V2) | |
|---|---|
| VARIABLE V2 (CHAMBER LIFE: THE NUMBER OF PROCESSED SUBSTRATES) | CHANGED UNIT RECIPE |
| 100 | UNIT RECIPE 1 |
| 300 | UNIT RECIPE 2001 |
| 400 | PREPARATORY PROCESS FIRST AND THEN UNIT RECIPE 1 |

FIG. 19B

| ID(SS1-1-V3) | |
|---|---|
| VARIABLE V3 (UNIT STATUS) | CHANGED UNIT RECIPE |
| NO ABNORMALITY | UNIT RECIPE 1 |
| ERROR IN NOZZLE 113 | UNIT RECIPE 2 |
| ERROR IN SPIN CHUCK 111 | NOT TO BE PROCESSED (TRANSPORT TO DIFFERENT UNIT) |

F I G. 1 9 C

| ID(SS1-1-V4) | |
|---|---|
| VARIABLE V4 (DEVICE STATUS) | CHANGED UNIT RECIPE |
| ERROR IN REVERSING UNIT RT1 | UNIT RECIPE 1 |
| ERROR IN REVERSING AND TRANSFERRING UNIT RT2 | UNIT RECIPE 1002 |
| ERROR IN CENTER ROBOT CR | NOT TO BE PROCESSED |

F I G. 1 9 D

| ID(SS1-1-V5) | |
|---|---|
| VARIABLE V5 (RECIPE EXECUTING STATUS) | CHANGED UNIT RECIPE |
| UNIT RECIPE 1 | UNIT RECIPE 1 |
| UNIT RECIPE 2 | PREPARATORY PROCESS FIRST AND THEN UNIT RECIPE 1 |
| UNIT RECIPE 3 | UNIT RECIPE 3 |

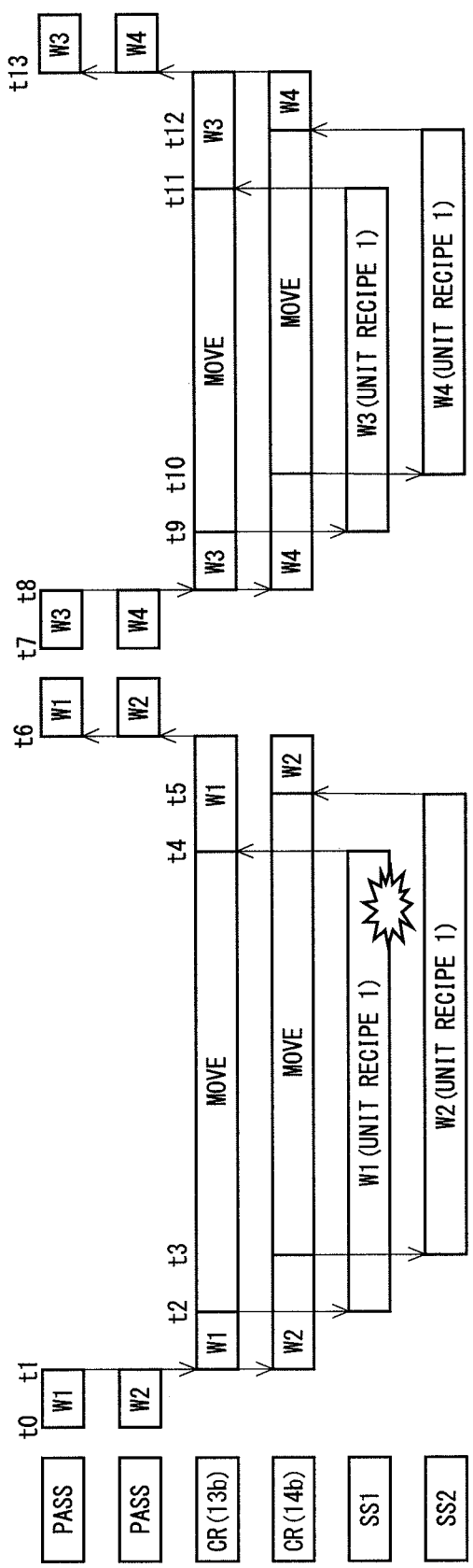

SUBSTRATE PROCESSING METHOD AND SUBSTRATE PROCESSING APPARATUS

CROSS-REFERENCE TO RELATED APPLICATIONS

The present application is a 35 U.S.C. §§ 371 national phase conversion of PCT/JP2015/050246, filed Jan. 7, 2015, which claims priority to Japanese Patent Application No. 2014-007398, filed Jan. 20, 2014, the contents of which are incorporated herein by reference. The PCT International Application was published in the Japanese language.

TECHNICAL FIELD

The present invention relates to a substrate processing method and a substrate processing apparatus.

BACKGROUND ART

There are various substrate processing apparatuses to process a substrate. For example, patent literature 1 discloses a substrate processing apparatus including a main transport robot that transport an unprocessed substrate and a processed substrate, and a processing unit that performs process such as cleaning on the substrate transported by the main transport robot.

According to patent literature 1, a sensor disposed in the processing unit detects a temperature, a humidity, etc. in the processing unit, recipe data is corrected based on a result of the detection, and substrate process is performed by the processing unit based on the corrected recipe data.

PRIOR ART LITERATURE

Patent Literature

Patent Literature 1: Japanese Patent Application Laid-Open No. 2007-123734

SUMMARY OF INVENTION

Problems to be Solved by Invention

However, patent literature 1 is merely intended for tuning of given recipe data based on sensor output. Thus, on the occurrence of an event that cannot be handled only by tuning of the recipe data, stopping the substrate process by the aforementioned processing unit is unavoidable. This reduces the operating rate and the throughput of the substrate processing apparatus due to stop of the operation of this processing unit.

The present invention has been made in view of the aforementioned problem. It is an object of the present invention to provide a technique capable of increasing the throughput of a substrate processing apparatus by allowing setting of a substrate processing schedule responsive to an event for implementation of a series of substrate processes.

Means of Solving Problems

To solve the aforementioned problem, a first invention is intended for a substrate processing method implemented in a substrate processing apparatus including a substrate processing unit for substrate process. The substrate processing method includes: a recipe identifying step of identifying a recipe for substrate process on a substrate; a schedule setting step of setting a substrate processing schedule based on the recipe, the substrate processing schedule including substrate process by the substrate processing unit; a detecting step of detecting the status of the substrate processing unit; a substitution necessity determining step of determining the necessity of substituting the recipe by a different recipe based on the status of the substrate processing unit detected as a result of the detecting step and the recipe; a schedule resetting step of substituting the recipe by a different recipe and resetting the substrate processing schedule based on the substituted recipe if substituting the recipe by a different recipe is determined to be necessary; and a substrate processing step of performing substrate process on the substrate according to the reset substrate processing schedule.

According to a second invention, in the substrate processing method according to the first invention, the status of a nozzle disposed in the unit is detected in the detecting step, and the necessity of substituting the recipe by a different recipe is determined based on whether or not the recipe uses the nozzle in the substitution necessity determining step.

According to a third invention, in the substrate processing method according to the first invention, the number of substrates having been processed by the substrate processing unit after final cleaning of the substrate processing unit is detected in the detecting step, and the necessity of substituting the recipe by a different recipe is determined based on the number of the processed substrates in the substitution necessity determining step.

A fourth invention is intended for a substrate processing method implemented in a substrate processing apparatus including a substrate processing unit for substrate process and substrate transporting means for transporting a substrate to the substrate processing unit. The substrate processing method includes: a recipe identifying step of identifying a recipe for substrate process; a schedule setting step of setting a substrate processing schedule based on the recipe, the substrate processing schedule including transport of the substrate by the substrate transporting means and substrate process on the substrate by the substrate processing unit; a detecting step of detecting the status of the substrate transporting means; a substitution necessity determining step of determining the necessity of substituting the recipe by a different recipe based on the status of the substrate transporting means detected as a result of the detecting step and the recipe; a schedule resetting step of substituting the recipe by a different recipe and resetting the substrate processing schedule based on the substituted recipe if substituting the recipe by a different recipe is determined to be necessary; and a step of transporting the substrate and performing substrate process on the substrate according to the reset substrate processing schedule.

A fifth invention is intended for a substrate processing apparatus including a substrate processing unit for substrate process. The substrate processing apparatus includes: recipe identifying means for identifying a recipe for substrate process on a substrate; schedule setting means for setting a substrate processing schedule based on the recipe, the substrate processing schedule including substrate process by the substrate processing unit; detecting means for detecting the status of the substrate processing unit; substitution necessity determining means for determining the necessity of substituting the recipe by a different recipe based on the status of the substrate processing unit detected by the detecting means and the recipe; schedule resetting means for substituting the recipe by a different recipe and resetting the substrate processing schedule based on the substituted recipe if sub- stituting the recipe by a different recipe is determined to be necessary by the substitution necessity determining means; and process executing means for performing substrate process on the substrate according to the reset substrate processing schedule.

According to a sixth invention, in the substrate processing apparatus according to the fifth invention, the detecting means detects the status of a nozzle disposed in the unit, and the substitution necessity determining means determines the necessity of substituting the recipe by a different recipe based on whether or not the recipe uses the nozzle.

According to a seventh invention, in the substrate processing apparatus according to the fifth invention, the detecting means detects the number of substrates having been processed by the substrate processing unit after final cleaning of the substrate processing unit, and the substitution necessity determining means determines the necessity of substituting the recipe by a different recipe based on the number of the processed substrates.

An eighth invention is intended for a substrate processing apparatus including a substrate processing unit for substrate process and substrate transporting means for transporting a substrate to the substrate processing unit. The substrate processing apparatus includes: recipe identifying means for identifying a recipe for substrate process; schedule setting means for setting a substrate processing schedule based on the recipe, the substrate processing schedule including transport of the substrate by the substrate transporting means and substrate process on the substrate by the substrate processing unit; detecting means for detecting the status of the substrate transporting means; substitution necessity determining means for determining the necessity of substituting the recipe by a different recipe based on the status of the substrate transporting means detected by the detecting means and the recipe; schedule resetting means for substituting the recipe by a different recipe and resetting the substrate processing schedule based on the substituted recipe if substituting the recipe by a different recipe is determined to be necessary; and process executing means for transporting the substrate and performing substrate process on the substrate according to the reset substrate processing schedule.

Advantageous Effects of Invention

According to the first to eighth inventions, on the occurrence of an event that cannot be handled by an intended recipe, this recipe can be substituted by a different recipe. As a result, the throughput of the substrate processing apparatus can be increased.

BRIEF DESCRIPTION OF DRAWINGS

FIG. 3 is a side view of the processing zone 3 according to the first embodiment.

FIG. 9 is a top view of the intermediary section 50 according to the first embodiment.

FIGS. 12A-12D are conceptual views showing substrate transfer between the center robot CR and the cleaning unit according to the first embodiment.

FIGS. 13A-13D are conceptual views showing substrate transfer between the center robot CR and the cleaning unit according to the first embodiment.

FIGS. 14A-14C are conceptual views showing substrate transfer between the center robot CR and the intermediary section 50 according to the first embodiment.

FIG. 15 is a table showing an exemplary substrate transport pattern that can be adopted by the substrate processing apparatus 1.

FIG. 16 is a diagram showing a data structure of a flow recipe FR1 according to the first embodiment.

FIG. 17 is a diagram showing a data structure of a flow recipe FR2 according to the first embodiment.

FIG. 19A is a diagram showing a data structure of the recipe change database CDB according to the first embodiment.

FIG. 19B is a diagram showing a data structure of the recipe change database CDB according to the first embodiment.

FIG. 19C is a diagram showing a data structure of the recipe change database CDB according to the first embodiment.

FIG. 19D is a diagram showing a data structure of the recipe change database CDB according to the first embodiment.

FIG. 21B is a timing diagram showing an exemplary schedule according to the first embodiment.

DESCRIPTION OF EMBODIMENT(S)

An embodiment of the present invention is described in detail below by referring to the accompanying drawings.

First Embodiment

1. Outline of Structure of Substrate Processing Apparatus 1

Figure 1:
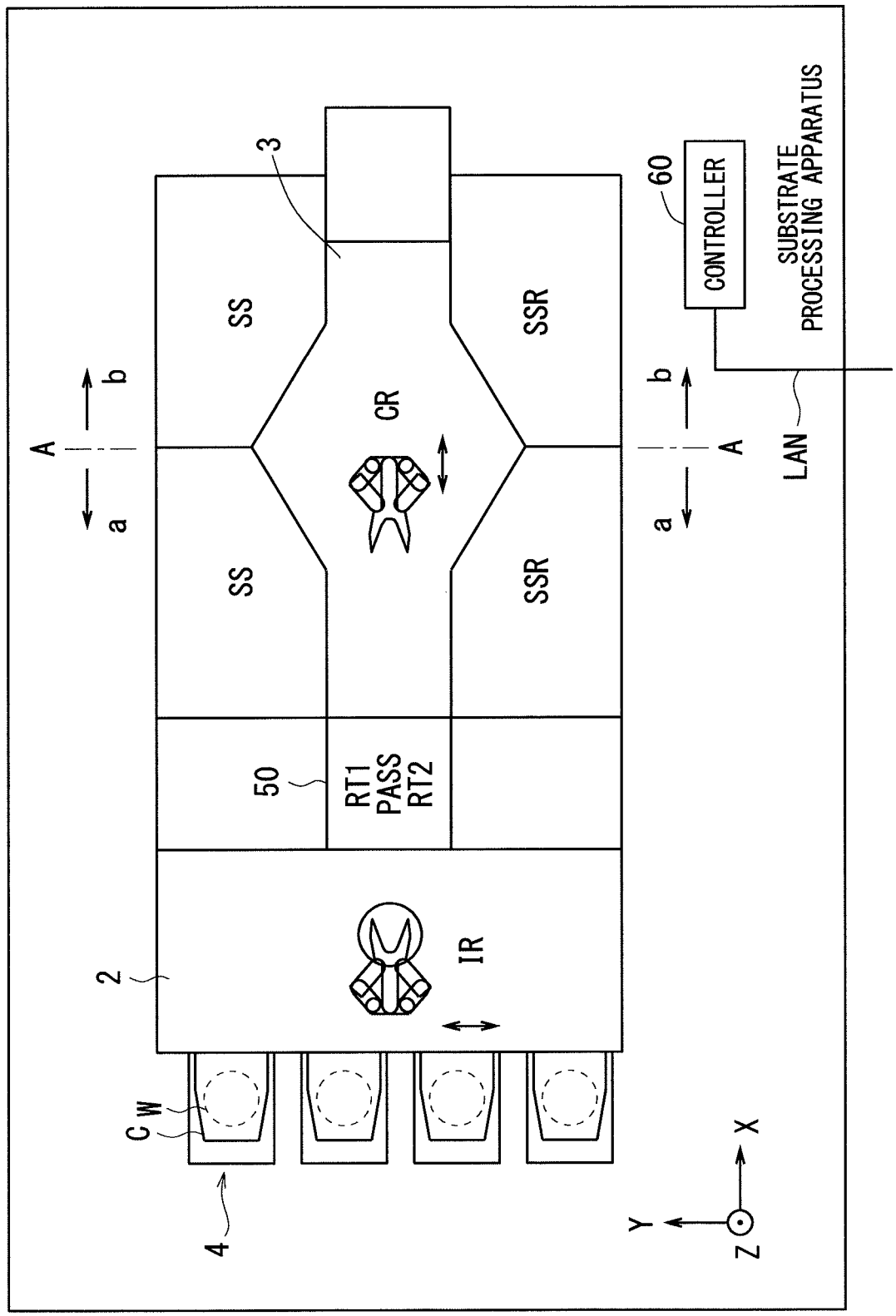
FIG. 1 is a schematic view showing an overall structure of a substrate processing apparatus 1 according to a first embodiment.
Figure 2:
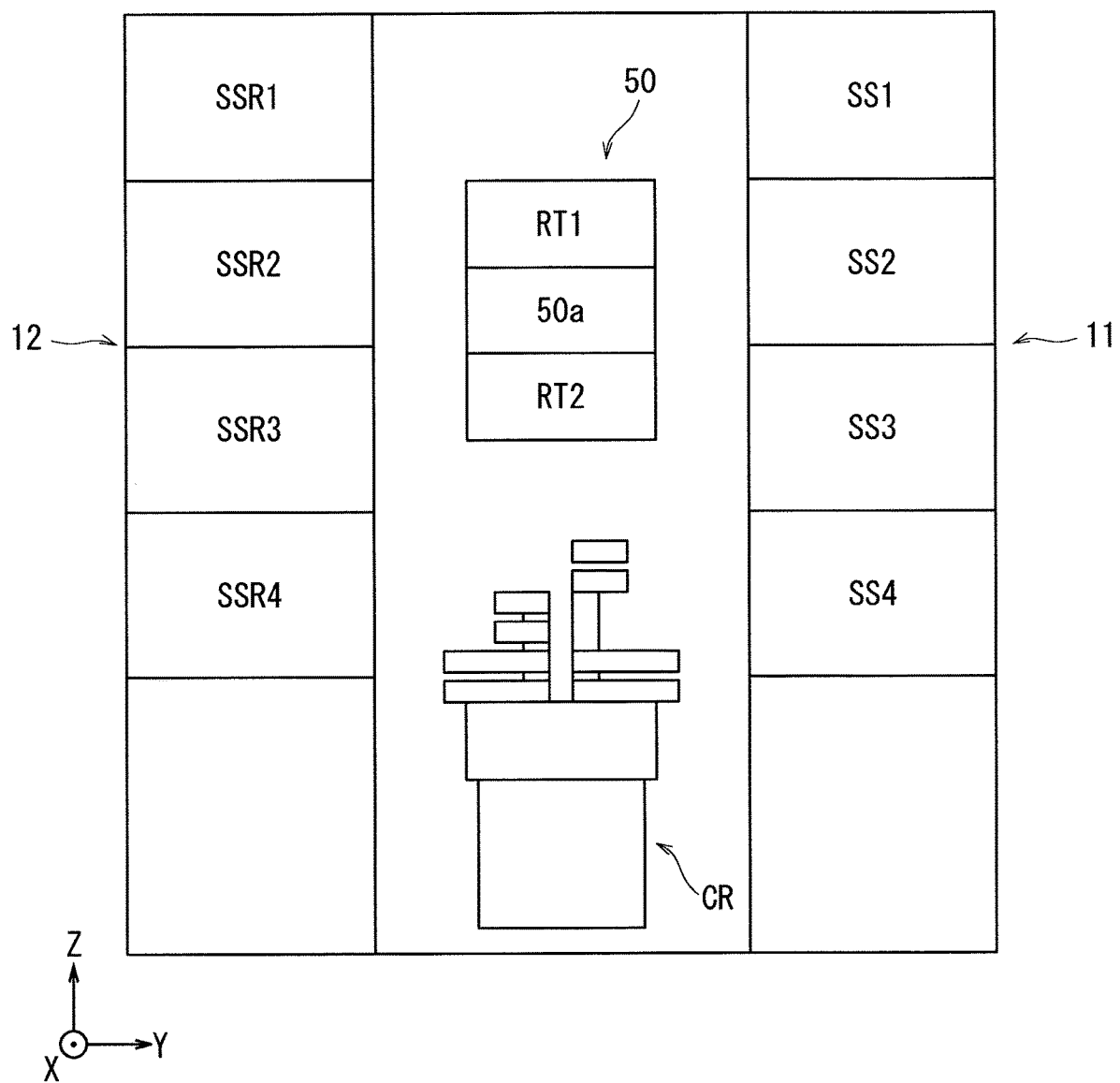
FIG. 2 is a side view of a processing zone 3 according to the first embodiment.

FIG. 1 is a plan view showing the layout of a substrate processing apparatus 1 according to a first embodiment of the present invention. FIG. 2 is a side view of the substrate processing apparatus 1 taken along a section A-A as viewed in the direction of an arrow a. FIG. 3 is a side view of the substrate processing apparatus 1 taken along the section A-A as viewed in the direction of an arrow b. In the drawings accompanying this specification, an X direction and a Y direction are two-dimensional coordinate axes defining a horizontal plane, and a Z direction defines a vertical direction perpendicular to the XY plane.

The substrate processing apparatus 1 is a single-wafer substrate cleaning apparatus that processes substrates W such as semiconductor wafers one by one. As shown in FIG. 1, the substrate processing apparatus 1 includes an indexer zone 2 and a processing zone 3 coupled to the indexer zone 2. An intermediary section 50 is arranged at a boundary between the indexer zone 2 and the processing zone 3. The intermediary section 50 is formed of an intermediary unit 50a for transferring a substrate W between an indexer robot IR and a center robot CR, a reversing unit (RT1) for reversing a substrate W for transfer of the substrate W to and from the center robot CR, and a reversing and transferring unit (RT2) for transferring a substrate W between the indexer robot IR and the center robot CR while reversing the substrate W. As shown in FIG. 2, the intermediary section 50 has a stacked structure with the reversing unit RT1 arranged on the intermediary unit 50a and the reversing and transferring unit RT2 arranged below the intermediary unit 50a.

The substrate processing apparatus 1 includes a controller 60 for control of the behavior of each device in the substrate processing apparatus 1. The processing zone 3 is a zone for substrate process such as scrub cleaning process described later. The substrate processing apparatus 1 as a whole functions as a single-wafer substrate cleaning apparatus.

The controller 60 is connected through a LAN to a host computer installed outside the substrate processing apparatus 1. The host computer transmits a flow recipe FR (FIG. 11) to the controller 60 that determines the substance of transport of each substrate W in the substrate processing apparatus 1 and the substance of substrate process by a front surface processing unit SS or a rear surface processing unit SSR. By referring to the received flow recipe FR, the controller 60 makes a transport schedule of each substrate W inside the substrate processing apparatus 1 and a schedule of substrate process by the front surface processing unit SS or the rear surface processing unit SSR.

As described in detail later, in the substrate processing apparatus 1 of the first embodiment, the controller 60 has a computer program stored in advance used for making a schedule of processing or transporting each substrate in the form of digital data. A computer forming the controller 60 executes this computer program, thereby realizing a schedule making device as one function of the controller 60.

<1.1 Indexer Zone>

The indexer zone 2 is a zone where a substrate W (unprocessed substrate W) received from outside of the substrate processing apparatus 1 is transported to the processing zone 3 and a substrate W (processed substrate W) received from the processing zone 3 is transported to the outside of the substrate processing apparatus 1.

The indexer zone 2 includes a carrier holding part 4 capable of holding a carrier C where a plurality of substrates W can be housed, the indexer robot IR functioning as substrate transporting means, and an indexer robot moving mechanism 5 (hereinafter called an "IR moving mechanism 5," see FIG. 10) that moves the indexer robot IR horizontally.

The carrier C can hold a plurality of substrates W horizontally arranged one above the other and spaced at regular intervals. The carrier C holds a plurality of substrates W while a front surface (one of two main surfaces where an electronic device is to be formed) of each of the substrates W is pointed upward. A plurality of carriers C is held by corresponding carrier holding parts 4 while being arranged in a given direction (in the first embodiment, Y direction). The IR moving mechanism 5 can move the indexer robot IR horizontally in the Y direction.

The carrier C housing an unprocessed substrate W is transported from outside of the apparatus for example by an OHT (overhead hoist transfer) or an AGV (automated guided vehicle) to each carrier holding part 4 and is then placed on the carrier holding part 4. A processed substrate W after subjected to substrate process such as scrub cleaning process in the processing zone 3 is transferred from the center robot CR to the indexer robot IR via the intermediary section 50, and is again housed in the carrier C on the carrier holding part 4. The carrier C housing the processed substrate W is transported for example by the OHT to the outside of the apparatus. Specifically, the carrier holding part 4 functions as a substrate collecting part of collecting an unprocessed substrate W and a processed substrate W.

The structure of the IR moving mechanism 5 in this embodiment is described below. A movable table is fixed to the indexer robot IR. The movable table is threadedly engaged with a ball screw extending in the Y direction parallel to the arrangement of the carriers C. The movable table is arranged in a manner that allows the movable table to make sliding motion freely along a guide rail. Thus, if the ball screw is rotated by a rotary motor, the movable table and the indexer robot IR fixed to the movable table entirely move horizontally along the Y-axis direction (all of them are not shown in the drawings).

In this way, the indexer robot IR is allowed to move freely in the Y direction. Thus, the indexer robot IR is allowed to move to a position where a substrate can be transported to and from each carrier C or the intermediary section 50 (in the below, incoming and outgoing transport of a substrate may be called "access" in some cases).

Figure 4:
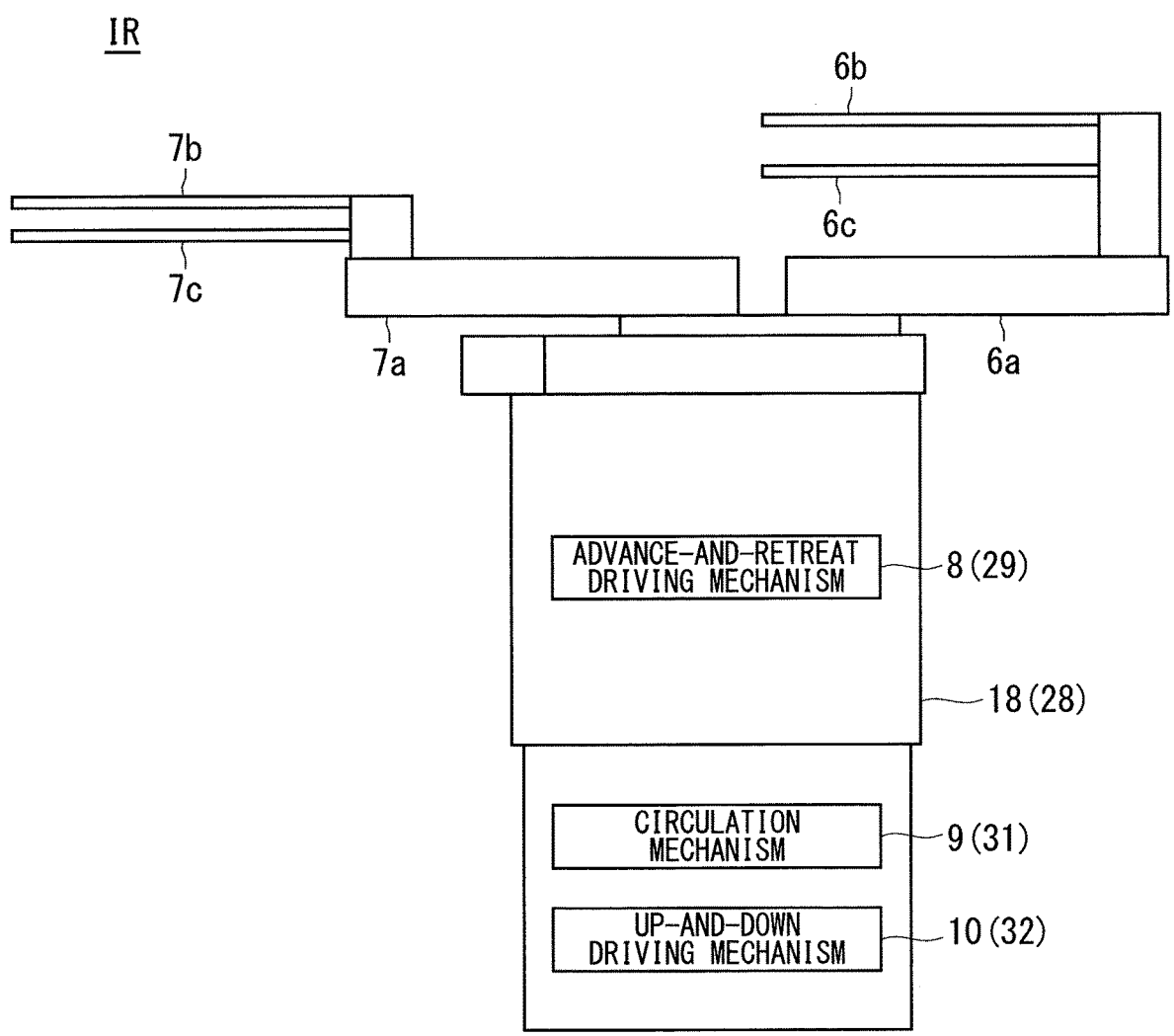
FIG. 4 is a schematic view showing the structure of an indexer robot IR according to the first embodiment.

FIG. 4 is a graphic side view of the indexer robot IR. A reference sign given to each element of FIG. 4 and shown in parentheses is a reference sign for an element of the center robot CR if the robot mechanism of the center robot CR has substantially the same degree of freedom as that of the robot mechanism of the indexer robot IR. Thus, the description of the indexer robot IR given herein makes reference to a reference sign outside parentheses.

The indexer robot IR has a base 18. An arm 6a and an arm 7a each have one end attached to the base 18. A hand 6b and a hand 6c are attached to an opposite end of the arm 6a, whereas a hand 7b and a hand 7c are attached to an opposite end of the arm 7a. The hands 6b and 6c are arranged one above the other at different heights so as not to interfere with each other. The hands 7b and 7c are arranged one above the other at different heights so as not to interfere with each other. (In FIG. 1, the hands 6b and 6c are shown to overlap vertically, and the hands 7b and 7c are shown to overlap vertically.)

As a result, the hands 6b and 6c are held by the base 18 via the arm 6a, whereas the hands 7b and 7c are held by the base 18 via the arm 7a.

Each of the hands 6b, 6c, 7b, and 7c has a tip formed as fingers in a pair. Specifically, the tip of each of the hands 6b, 6c, 7b, and 7c is formed like a bifurcated fork as viewed from above. Each of the hands 6b, 6c, 7b, and 7c can hold one substrate W horizontally by supporting the lower surface of the substrate W from below. In this embodiment, the hands 7b and 7c are used for transport of only an unprocessed substrate before subjected to cleaning process, whereas the hands 6b and 6c are used for transport of only a processed substrate after subjected to cleaning process.

The outer size of the fingers in a pair of each hand is smaller than a gap between support members 54 in a pair of the intermediary section 50 facing each other (FIG. 9) described later. This allows each of the hands 6b, 6c, 7b, and 7c to transport a substrate W to and from the intermediary section 50 without interfering with the support members 54 during incoming transport and outgoing transport of a substrate described later.

The outer size of the fingers in a pair of each of the hands 6b, 6c, 7b, and 7c is smaller than the diameter of a substrate W. Thus, a substrate W can be held stably with each of the hands 6b, 6c, 7b, and 7c. The indexer robot IR is a robot mechanism with the four hands 6b, 6c, 7b, and 7c that can transport up to two unprocessed substrates simultaneously and up to two processed substrates simultaneously.

Each of the arms 6a and 7a is an articulated bending and stretching arm. The indexer robot IR can make an advance-and-retreat driving mechanism 8 expand and contract the arms 6a and 7a individually. This allows the hands 6b and 6c corresponding to the arm 6a and the hands 7b and 7c corresponding to the arm 7a to separately advance and retreat horizontally. The base 18 includes a built-in circulation mechanism 9 for rotating the base 18 around a vertical axis line, and a built-in up-and-down driving mechanism 10 for moving the base 18 up and down in the vertical direction.

The aforementioned structure allows the IR moving mechanism 5 to move the indexer robot IR freely in the Y direction. The circulation mechanism 9 and the up-and-down driving mechanism 10 can change the angle of each hand of the indexer robot IR in a horizontal plane and change the height of each hand of the indexer robot IR in the vertical direction.

Thus, each of the hands 6b, 6c, 7b, and 7c of the indexer robot IR is allowed to face the carrier C and the intermediary section 50. While the hands 6b and 6c and the hands 7b and 7c face the carrier C, the indexer robot IR expands the arm 6a or 7a, thereby allowing the hands 6b and 6c corresponding to the arm 6a and the hands 7b and 7c corresponding to the arm 7a to access this carrier C or the intermediary section 50.

<1.2 Processing Zone>

The processing zone 3 is a zone where an unprocessed substrate W transported from the indexer zone 2 is subjected to cleaning process and a processed substrate W after subjected to the cleaning process is returned to the indexer zone 2.

The processing zone 3 includes a front surface cleaning processor 11 that cleans the front surfaces of substrates W one by one, a rear surface cleaning processor 12 that cleans the rear surfaces of substrates W one by one, the center robot CR functioning as substrate transporting means, and a center robot moving mechanism 17 (hereinafter called a "CR moving mechanism 17," see FIG. 10) that moves the center robot CR horizontally. The structure of each device in the processing zone 3 is described below.

As shown in FIGS. 1 to 3, the front cleaning processor 11 has two groups including a group of front surface cleaning units SS1 to SS4 and a group of front surface cleaning units SS5 to SS8. The front surface cleaning units in each group are stacked one above the other in four tiers. The rear cleaning processor 12 has two groups including a group of rear surface cleaning units SSR1 to SSR4 and a group of rear surface cleaning units SSR5 to SSR8. The rear surface cleaning units in each group are stacked one above the other in four tiers.

As shown in FIG. 1, the front and rear surface cleaning processors 11 and 12 are juxtaposed and separated by a given distance in the Y direction. The center robot CR is arranged between the front and rear surface cleaning processors 11 and 12.

Figure 5:
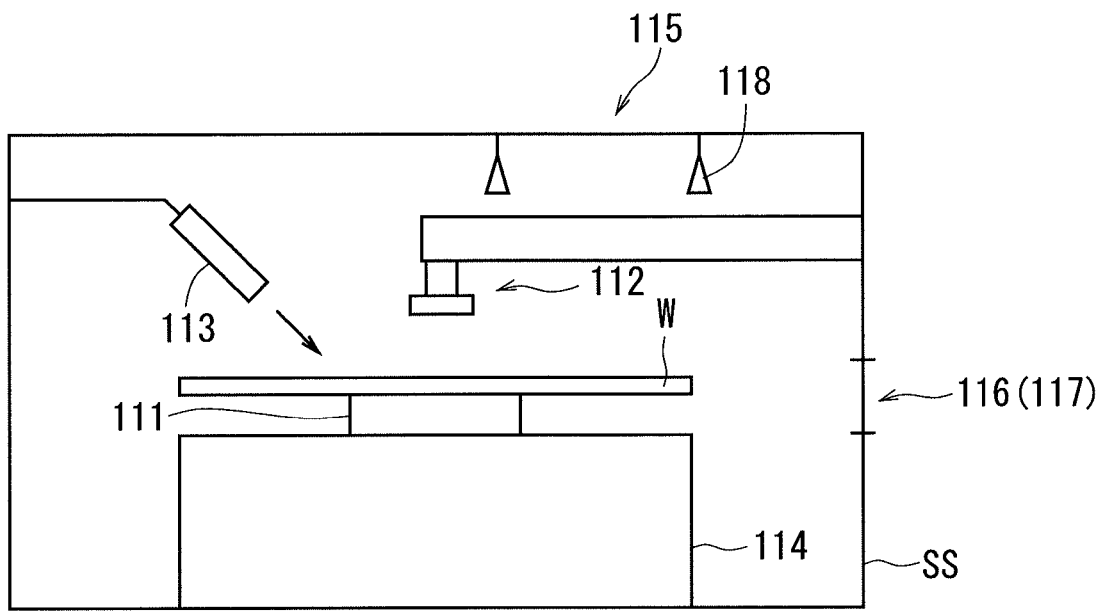
FIG. 5 is a schematic view showing the structure of a cleaning unit according to the first embodiment.

FIG. 5 shows how scrub cleaning process is performed on the front surface of a substrate W in each of the cleaning units SS1 to SS8 of the front surface cleaning processor 11. The cleaning units SS1 to SS8 each include a spin chuck 111 to hold a substrate W and rotate the substrate W around a core extending in the vertical direction while placing the substrate W in a horizontal posture with the front surface thereof pointed upward, a cleaning brush 112 to abut on or get close to the front surface of the substrate W held on the spin chuck 111 for scrub cleaning process, a nozzle 113 from which a cleaning liquid (such as pure water) is discharged to the front surface of the substrate W, a spin rotation support 114 to rotate the spin chuck 111, a cup (not shown in the drawings) surrounding the periphery of the substrate W held on the spin chuck 111, and a unit case 115 housing these members. The unit case 115 is provided with a gate 117 with a slit 116 that can be opened and closed by sliding through which a substrate W is transported to and from the unit case 115.

A top plate or a side plate of each of the cleaning units SS1 to SS8 is provided with a unit cleaning liquid nozzle 118 from which a cleaning liquid is discharged for cleaning the inside of each of the units SS1 to SS8.

The rear surface cleaning processor 12 performs scrub cleaning process on the rear surface of a substrate W. Like the front surface cleaning units SS1 to SS8, the rear surface cleaning units SSR1 to SSR8 each include a spin chuck, a cleaning brush, a nozzle, a spin motor, a cup, a unit case housing these members, and a unit cleaning liquid nozzle. The unit case is provided with a gate with a slit that can be opened and closed through which a substrate W is transported to and from the unit case (all of these members are not shown in the drawings).

The spin chuck 111 in each of the front surface cleaning units SS1 to SS8 may adopt a vacuum suction system of holding a substrate W from its rear surface. Meanwhile, it is preferable that the spin chuck 111 in each of the rear surface cleaning units SSR1 to SSR8 adopt a system of mechanically gripping an edge portion of a substrate W to hold the substrate from its front surface.

For cleaning the front surface of a substrate W with the cleaning brush 112, a brush moving mechanism not shown in the drawings moves the cleaning brush 112 to a position above a substrate W held on the spin chuck 111 with the front surface thereof pointed upward. Then, a processing liquid (such as pure water (deionized water)) is supplied from the nozzle 113 onto the upper surface of the substrate W while the spin chuck 111 rotates the substrate W and the cleaning brush 112 is made to contact the upper surface of the substrate W. With the cleaning brush 112 contacting the upper surface of the substrate W, the cleaning brush 112 is moved along the upper surface of the substrate W. As a result, the upper surface of the substrate W is scanned with the cleaning brush 112, so that the entire front surface of the substrate W can be subjected to scrub cleaning process. In this way, the front surface of the substrate W is processed. The rear surface of the substrate W is cleaned in the same way.

Although not shown in the drawings, a sensor to detect abnormality in the nozzle 113, the spin chuck 111, or the spin rotation support 114 is provided in every part of the cleaning unit SS (SSR).

A procedure of standard processes performed by the cleaning unit SS (SSR) and conditions for these processes are determined in advance as a unit recipe. A storage 64 of the controller 60 described later has a unit recipe database UDB (FIG. 11) storing a plurality of unit recipes. Each unit recipe is given a unique recipe number. An operator can make a unit recipe by operating an input part 66. Alternatively, a unit recipe can be given from the host computer to the controller 60 through a LAN 65 and then stored in the unit recipe database UDB.

The processing unit SS (SSR) can perform preparatory process and post-process in addition to the aforementioned substrate process.

In the preparatory process, before a target substrate W is transported to the processing unit SS (SSR), the processing unit SS (SSR) is cleaned, controlled in atmosphere, or controlled in temperature. For example, before the target substrate W is transported, a unit cleaning liquid is discharged from the unit cleaning liquid nozzle 118 to clean each part of the processing unit SS (SSR). In this way, the inside of the processing unit SS (SSR) can be cleaned in advance. Further, by discharging liquid such as pure water controlled in temperature from the unit cleaning lipid nozzle 118 or by actuating a heater not shown in the drawings, each member and an atmosphere inside the processing unit SS (SSR) can be set at a temperature suitable for substrate process to be performed on the target substrate W.

In the post-process, after a target substrate W is transported to the processing unit SS (SSR), the processing unit SS (SSR) is cleaned, controlled in atmosphere, or controlled in temperature. For example, after the target substrate W is transported, a unit cleaning liquid is discharged from the unit cleaning liquid nozzle 118 to clean each part of the processing unit SS (SSR). In this way, a processing liquid having been used for substrate process on the substrate W can be removed from the inside of the processing unit SS (SSR). Further, even if the inside of the processing unit SS (SSR) is heated as a result of substrate process on the substrate W, by discharging liquid such as pure water controlled in temperature from the unit cleaning liquid nozzle 118 or by actuating a heater not shown in the drawings, the inside the processing unit SS (SSR) can be cooled to a temperature suitable for general substrate process (such as room temperature).

A standard procedure of the preparatory process and that of the post-process performed by the cleaning unit SS (SSR) and conditions therefor are determined in advance. Like those of the substrate process, these procedures and conditions are summarized as a unit recipe. A unit recipe for the preparatory process and that for the post-process are given their unique recipe numbers and are stored in the unit recipe database UDB of the storage 64.

In this embodiment, the cleaning units SS1 to SS8 and SSR1 to SSR8 in the cleaning processors 11 and 12 are described as devices to perform scrub cleaning on a substrate W. Meanwhile, the scrub cleaning is not the only substrate process performed by the cleaning units SS1 to SS8 and SSR1 to SSR8 in the cleaning processors 11 and 12. As an example, each of the cleaning units SS1 to SS8 and SSR1 to SSR8 may be a cleaning unit to clean substrates W one by one with a processing liquid (such as a cleaning liquid or a rinsing liquid) or a fluid such as gas discharged for example from a nozzle facing the front surface or the rear surface of a substrate without using a brush.

Figure 6:
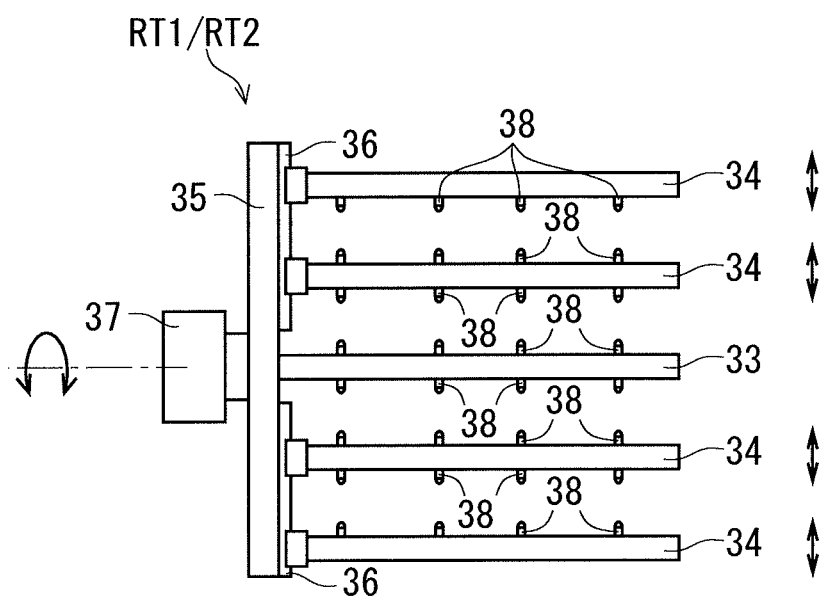
FIG. 6 is a schematic view showing the structure of a reversing unit RT according to the first embodiment.

FIG. 6 is a graphic side view of the reversing unit RT1 and the reversing and transferring unit RT2. The reversing unit RT1 and the reversing and transferring unit RT2 differ only in that the former is accessible only from the center robot CR, whereas the latter is accessible not only from the center robot CR but also from the indexer robot IR. Thus, the reversing unit RT1 and the reversing and transferring unit RT2 are both described by referring to FIG. 6.

The reversing unit RT1 is a processing unit to perform reversing process on a substrate W transported to the reversing unit RT1 by the center robot CR. After the reversing unit RT1 reverses the substrate W, the center robot CR transports this substrate W from the reversing unit RT1.

The reversing and transferring unit RT2 is accessible both from the indexer robot IR and the center robot CR. After the indexer robot IR transports a substrate W to the reversing and transferring unit RT2, the reversing and transferring unit RT2 reverses this substrate W. Then, the center robot CR transports this reversed substrate W from the reversing and transferring unit RT2. After the center robot CR transports a substrate W to the reversing and transferring unit RT2, the reversing and transferring unit RT2 reverses this substrate W. Then, the indexer robot IR transports this reversed substrate W from the reversing and transferring unit RT2.

In the substrate processing apparatus 1 of the first embodiment, each of the cleaning units SS1 to SS8 and SSR1 to SSR8 in the front and rear surface cleaning processors 11 and 12 performs cleaning process on the upper surface of a substrate. (The upper surface is irrelevant to the front or rear side of a substrate. A side facing upward in the vertical direction at the time of the process is called an upper surface, whereas a side facing downward in the vertical direction at the time of the process is called a lower surface.) Thus, for cleaning process on both surfaces of a substrate, for example, not only the cleaning process on a substrate W but also reversing process on the substrate W becomes necessary. The reversing unit RT1 and the reversing and transferring unit RT2 are used for this reversal.

As shown in FIG. 6, the reversing unit RT includes a fixed plate 33 arranged horizontally, and four movable plates 34 arranged horizontally while holding the fixed plate 33 between the movable plates 34 from above and below. The fixed plate 33 and the movable plates 34 each have a rectangular shape and are arranged to overlap each other in a plan view. The fixed plate 33 is fixed to a support plate 35 in a horizontal posture. The movable plates 34 are each attached to the support plate 35 in a horizontal posture via a guide 36 extending in the vertical direction.

The movable plates 34 are each movable in the vertical direction relative to the support plate 35. The movable plates 34 are each moved in the vertical direction by an actuator such as an air cylinder not shown in the drawings. A rotary actuator 37 is attached to the support plate 35. The fixed plate 33 and the four movable plates 34 are rotated integrally together with the support plate 35 around a horizontal rotary axis line by the rotary actuator 37. The rotary actuator 37 can turn the fixed plate 33 and the four movable plates 34 upside down by rotating the support plate 35 180 degrees about the horizontal rotary axis line.

A plurality of support pins 38 is attached to each of surfaces facing each other out of surfaces of the fixed plate 33 and those of the four movable plates 34 (as an example, the lower surface of the movable plate 34 above the fixed plate 33 and the upper surface of the fixed plate 33). The support pins 38 are spaced at appropriate intervals on a corresponding surface around a circumference corresponding to the outer circumferential shape of a substrate W. The height of each support pin 38 (length from a base end toward a tip) is constant. This height is greater than the thickness (length in the vertical direction) of the hands 6b and 6c, 7b and 7c, and hands 13b to 16b.

The fixed plate 33 can support one substrate W horizontally in a position above the fixed plate 33 via the support pins 38. Each of the four movable plates 34 can support one substrate W horizontally in a position above this movable plate 34 via the support pins 38 when this movable plate 34 is below the substrate W. A gap in the vertical direction between the position where the fixed plate 33 supports a substrate and the position where the movable plate 34 supports a substrate is set to be the same as a gap in the vertical direction between two substrates W held by the hands 6b and 6c or 7b and 7c of the indexer robot IR and a gap in the vertical direction between two substrates W held by corresponding ones of the hands 13b to 16b of the center robot CR.

As a result of the aforementioned structure of the reversing unit RT1, the center robot CR can make a substrate W held by each of the hands 13b to 16b access the reversing unit RT1 (can transport the substrate W to and from the reversing unit RT1). As a result of the aforementioned structure of the reversing and transferring unit RT2, the indexer robot IR and the center robot CR (in the below, the indexer robot IR and the center robot CR may be called collectively as "robots IR and CR") can make a substrate W held by each of the hands 6b and 6c, 7b and 7c, and 13b to 16b access the reversing and transferring unit RT2 (can transport the substrate W to and from the reversing and transferring unit RT2). Transfer of a substrate W is described in detail later.

The indexer robot IR or the center robot CR inserts a first substrate W in a gap between the fixed plate 33 and the movable plate 34 directly above the fixed plate 33 and a second substrate W in a gap between this movable plate 34 and the movable plate 34 still above the former movable plate 34. In this state, these two movable plates 34 are moved toward the fixed plate 33, so that these two substrates W can be held by the reversing unit RT1 or the reversing and transferring unit RT2. Likewise, a first substrate W can be held in a gap between the fixed plate 33 and the movable plate 34 directly below the fixed plate 33 and a second substrate W can be held in a gap between this movable plate 34 and the movable plate 34 still below the former movable plate 34.

While the substrates W are held in the reversing unit RT, the rotary actuator 37 rotates the support plate 35 around the horizontal rotary axis line. As a result, the two substrates W being held can be turned upside down. As described above, the reversing unit RT and the reversing and transferring unit RT2 can hold a plurality of substrates W (in the first embodiment, two substrates W) horizontally and turn the held substrates W upside down.

The structure of the CR moving mechanism 17 is the same as the aforementioned IR moving mechanism 5. Specifically, the CR moving mechanism 17 is formed of a movable table, a ball screw and a guide rail extending lengthwise in the X direction, and a rotary motor to rotate the ball screw that are not shown in the drawings. The rotation of the ball screw moves the entire center robot CR fixed to the movable table horizontally in the X direction inside the processing zone 3 while crossing space between the front and rear surface cleaning processors 11 and 12. In this way, the center robot CR is freely movable in the X direction, so that the center robot CR can move to a position that allows access (incoming and outing transport) to each of the cleaning units SS1 to SS8 and SSR1 to SSR8. The center robot CR can also move to a position that allows access (incoming and outgoing transport) to the intermediary section 50.

The center robot CR may adopt a robot mechanism of a structure substantially the same as that of the indexer robot IR of FIG. 4, specifically a structure where vertically arranged two groups each including hands in two tiers fixed relative to each other are allowed to advance and retreat independently (in the below, this mechanism is called a "2A4H mechanism" indicating a mechanism with "arms in two groups and four hands"). The center robot CR may also have a difference structure. The center robot CR adopting a robot of the 2A4H mechanism includes components same as those shown in FIG. 4 described relating to the indexer robot IR, so that these components are not described here repeatedly.

Figure 7A:
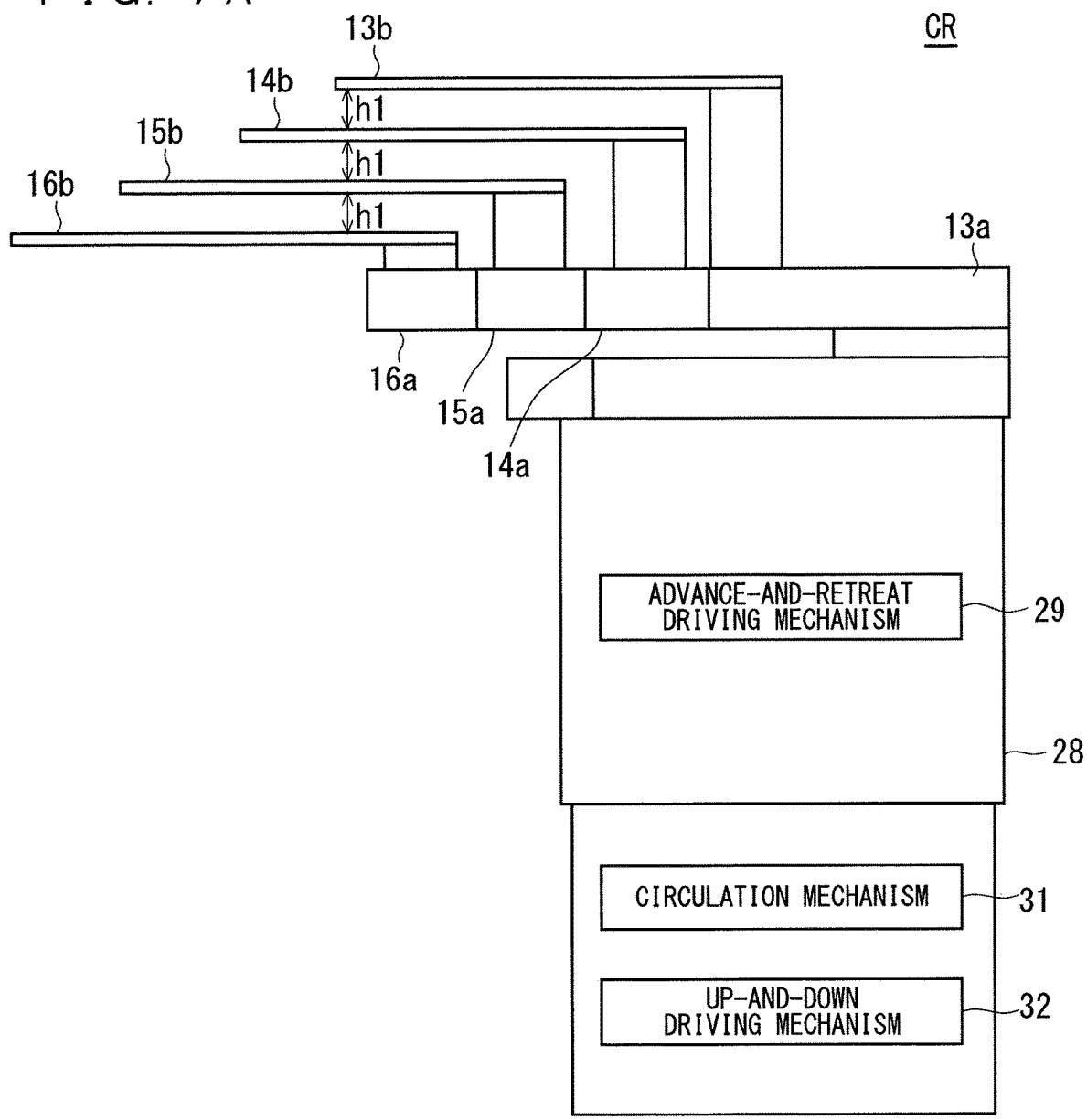
FIGS. 7A and 7B are schematic views showing the structure of a center robot CR according to the first embodiment.
Figure 7B:
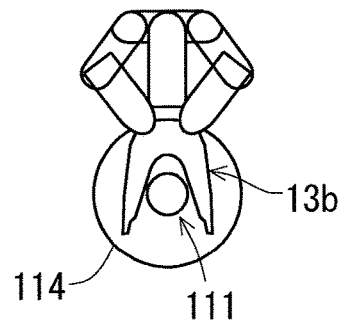

FIG. 7A is a graphic side view of the center robot CR configured in a manner such that four arms 13a to 16a enable advancing and retreating of the four hands 13b to 16b independently respectively (hereinafter called a "4A4H mechanism"). FIG. 7B is a graphic top view showing how the center robot CR accesses the cleaning unit SS (SSR) during incoming transport and outgoing transport of a substrate described later.

As shown in FIG. 7A, the center robot CR of the 4A4H mechanism includes a base 28. The arms 13a to 16a each have one end attached to the base 28. Respective opposite ends of the arms 13a to 16a are attached to the hands 13b to 16b respectively. In this way, the hands 13b to 16b are held by the base 28 via the arms 13a to 16a respectively.

The hands 13b to 16b are arranged one above the other at different heights (spaced by the same distance h1 in the vertical direction) in such a manner that adjacent ones of the hands 13b to 16b do not interfere with each other. Each of the hands 13b to 16b has a tip with fingers in a pair. Specifically, the tip of each of the hands 13b to 16b is formed like a bifurcated fork as viewed from above. Each of the hands 13b to 16b can hold one substrate W horizontally by supporting the lower surface of the substrate W from below. In this embodiment, the hands 15b and 16b are used for transport of only an unprocessed substrate before subjected to cleaning process, whereas the hands 13b and 14b are used for transport of only a processed substrate after subjected to cleaning process.

The outer size of the fingers in a pair of each of the hands 13b to 16b is smaller than a gap between opposite support pins 55 in a pair of the intermediary section 50. This allows each of the hands 13b to 16b to avoid interference with the support members 54 of the intermediary section 50 during incoming transport and outgoing transport of a substrate described later.

A member passage region is formed between the fingers in a pair of each of the hands 13b to 16b. This region is larger than the spin chuck 111 in the cleaning unit SS (SSR). This allows each of the hands 13b to 16b to avoid interference with the spin chuck 111 during incoming transport and outgoing transport of a substrate described later. (see FIG. 70) 7B). The thickness of each of the hands 13b to 16b is smaller than a gap between the upper surface of the spin chuck 111 and the upper surface of the spin rotation support 114. Each of the arms 13a to 16a is an articulated bending and stretching arm. The center robot CR can make an advance-and-retreat driving mechanism 29 expand and contract the arms 13a to 16a individually. This allows the hands 13b to 16b corresponding to the arms 13a to 16a respectively to separately move horizontally. The base 28 includes a built-in circulation mechanism 31 for rotating the base 28 around the vertical axis line, and a built-in up-and-down driving mechanism 32 for moving the base 28 up and down in the vertical direction.

The CR moving mechanism 17 moves the center robot CR to a position where the center robot CR is accessible to each of the cleaning units SS1 to SS8 and SSR1 to SSR8. Then, the circulation mechanism 31 rotates the base 28 to rotate each of the hands 13b to 16b around a certain vertical axis line. Meanwhile, the up-and-down driving mechanism 32 moves the base 28 up and down in the vertical direction. As a result, an arbitrary one of the hands 13b to 16b is allowed to face a desired one of the cleaning units SS1 to SS8 and SSR1 to SSR8. While one of the hands 13b to 16b faces a cleaning unit, a corresponding one of the arms 13a to 16a is expanded, thereby allowing one of the hands 13b to 16b corresponding to this arm to access this cleaning unit. The center robot CR can make an arbitrary one of the hands 13b to 16b access the intermediary section 50 in the same way.

According to both the 2A4H mechanism and the 4A4H mechanism adopted by the center robot CR, up to two unprocessed substrates can be transported together (simultaneously) from the intermediary section 50 to each of the processing units SS1 to SS8 and SSR1 to SSR8 and up to two processed substrates can be transported together from each of the processing units SS1 to SS8 and SSR1 to SSR8 to the intermediary section 50. The 2A4H mechanism and the 4A4H mechanism achieve the same maximum number of substrates that can be transported together. Thus, for the convenience of description, the center robot CR adopting the 4A4H mechanism is used in the following description. Meanwhile, the respective behaviors of the arms of the center robot CR adopting the 2A4H mechanism can be understood based on the analogy with the arm behavior of the indexer robot IR.

In the foregoing description, each of the hands 13b to 16b of the center robot CR is allowed to access the processing units SS and SSR and the intermediary section 50 by combined use of the CR moving mechanism 17. Alternatively, using only the circulation mechanism 31, the up-and-down driving mechanism 32, and the advance-and-retreat driving mechanism 29 of the center robot CR without using the CR moving mechanism 17 can certainly make each of the hands 13b to 16b of the center robot CR access the processing units SS and SSR and the intermediary section 50.

A sensor to detect abnormality in the respective behaviors of the IR moving mechanism 5, the indexer robot IR, the CR moving mechanism 17, and the center robot CR is provided to each part of these mechanisms.

<1.3 Intermediary Unit 50a>

The intermediary unit 50a for transfer of a substrate W between the indexer robot IR and the center robot CR is arranged at a boundary between the indexer zone 2 and the processing zone 3. The intermediary unit 50a is a casing housing substrate placement parts PASS1 to PASS4. For transfer of a substrate W between the indexer robot IR and the center robot CR, the substrate W is temporarily placed in the substrate placement parts PASS1 to PASS4.

Figure 8:
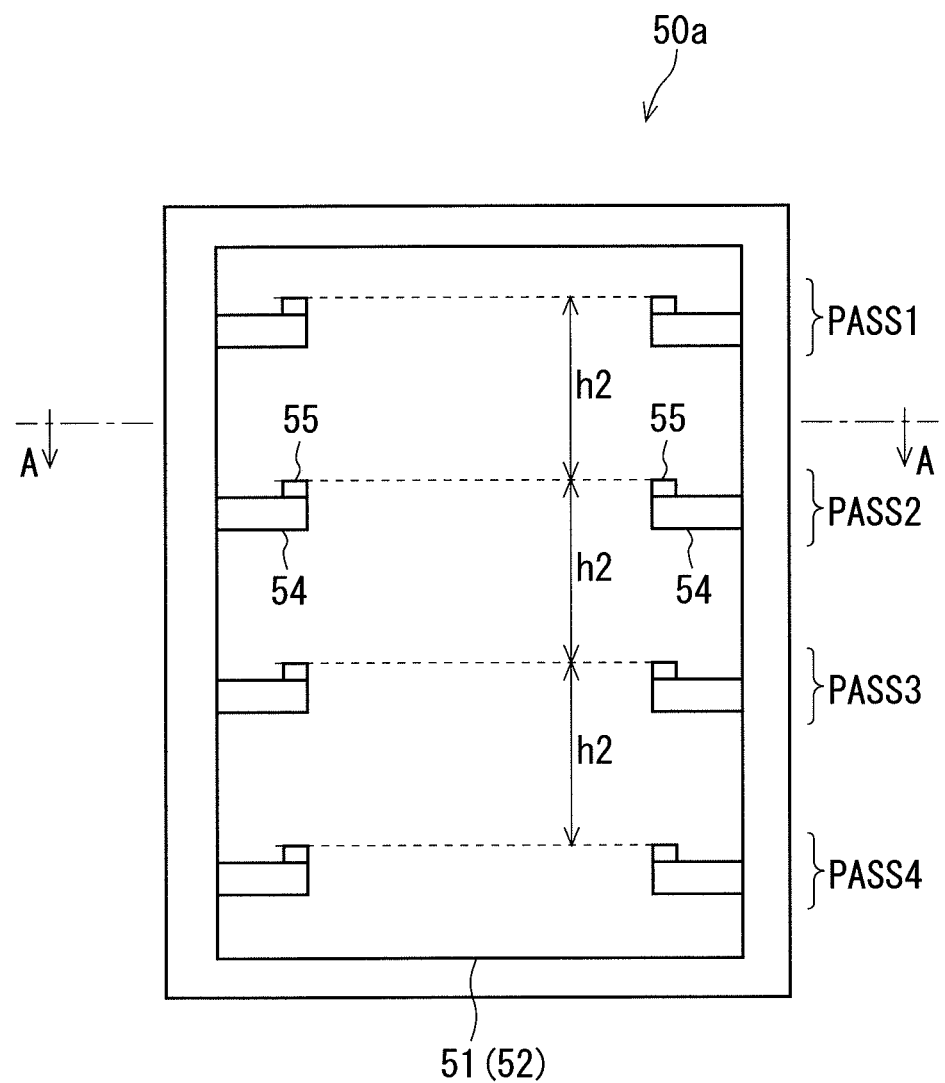
FIG. 8 is a side view of an intermediary section 50 according to the first embodiment.

FIG. 8 is a side view of the intermediary unit 50a of the first embodiment. FIG. 9 is a top view taken along a section A-A in the direction of arrows of FIG. 8. A side wall of the casing of the intermediary unit 50a facing the indexer robot IR is provided with an opening 51 for incoming and outgoing transport of a substrate W. A different side wall facing the former side wall and closer to the center robot CR is provided with an opening 52 for the same purpose.

The substrate placement parts PASS1 to PASS4 where the substrate W is supported in a substantially horizontal posture are provided in an area of the casing facing the openings 51 and 52. This allows the indexer robot IR and the center robot CR to access the substrate placement parts PASS1 to PASS4 through the openings 51 and 52 respectively. In this embodiment, the upper substrate placement parts PASS1 and PASS2 are used for transport of a processed substrate W from the processing zone 3 to the indexer zone 2. The lower substrate placement parts PASS3 and PASS4 are used for transport of an unprocessed substrate W from the indexer zone 2 to the processing zone 3.

As shown in FIGS. 8 and 9, the substrate placement parts PASS1 to PASS4 are each formed of support members 54 in a pair fixed to side walls inside the casing, and four support pins 55 in two groups provided at opposite end portions of the upper surface of each support member 54. The support members 54 are fixed to the side walls in a pair different from the side walls where the openings 51 and 52 are formed. The support pins 55 are formed into conical shapes at their upper ends. Thus, a substrate W is supported by the support pins 55 in two pairs fitted at four places of the circumferential part of the substrate W in such a manner that the substrate W can be detached from the support pins 55.

The support pins 55 between PASS1 and PASS2, between PASS2 and PASS3, and between PASS3 and PASS4 are spaced by the same distance h2 in the vertical direction (see FIG. 8). The distance h2 is the same as the aforementioned distance h1 in the vertical direction between the hands 13b to 16b of the center robot CR. As a result, by making the advance-and-retreat driving mechanism 29 expand the hands 15b and 16b of the center robot CR simultaneously while the center robot CR faces the intermediary unit 50a, two unprocessed substrates W can be received simultaneously from the substrate placement parts PASS3 and PASS4 of the intermediary unit 50a. Likewise, by making the advance-and-retreat driving mechanism 29 expand the hands 13b and 14b of the center robot CR simultaneously, two processed substrates W held by the hands 13b and 14b can be transferred simultaneously to the substrate placement parts PASS1 and PASS2 of the intermediary unit 50a.

<1.4 Controller 60>

Figure 10:
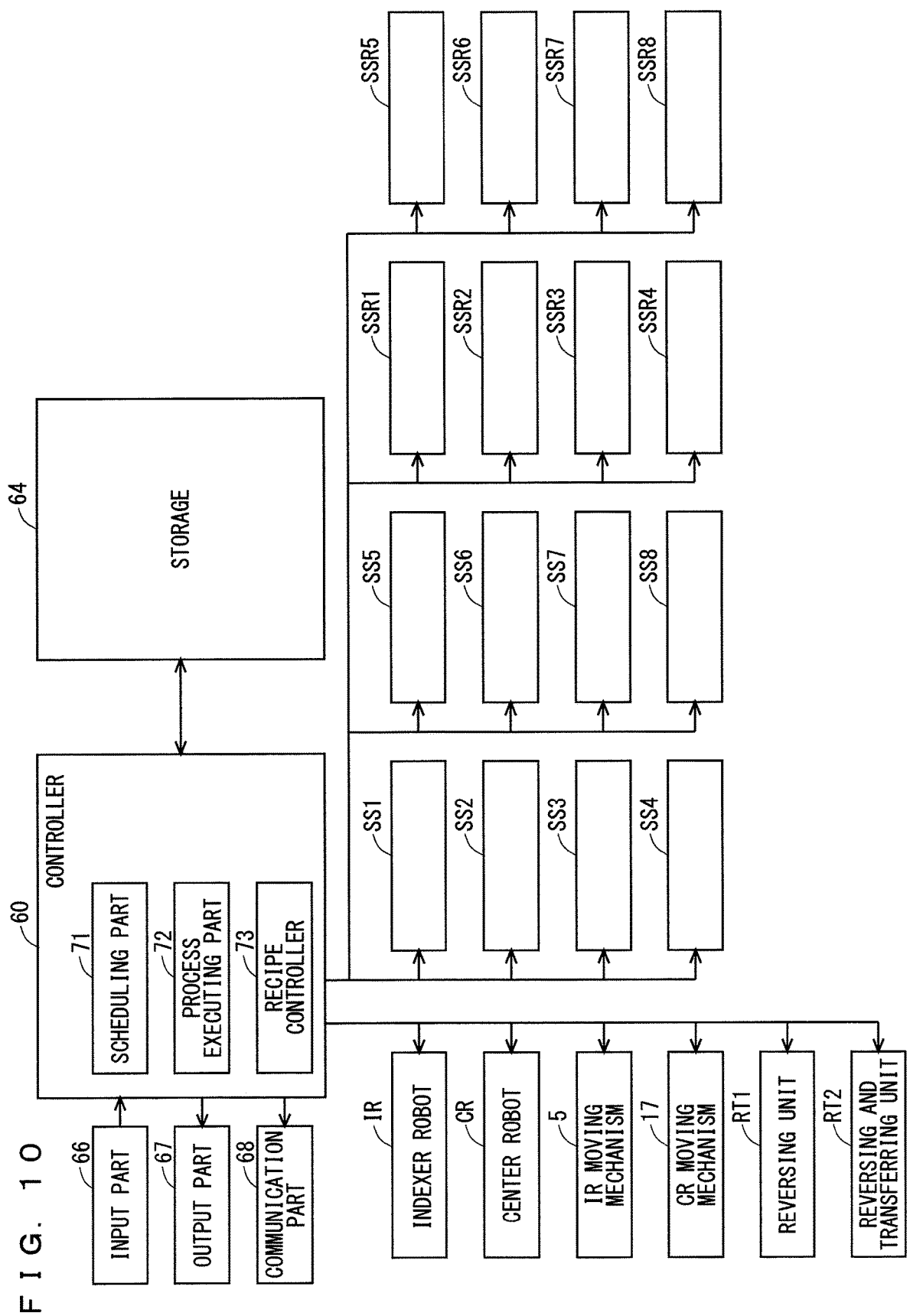
FIG. 10 is a systematic block diagram of the substrate processing apparatus 1 according to the first embodiment.
Figure 11:
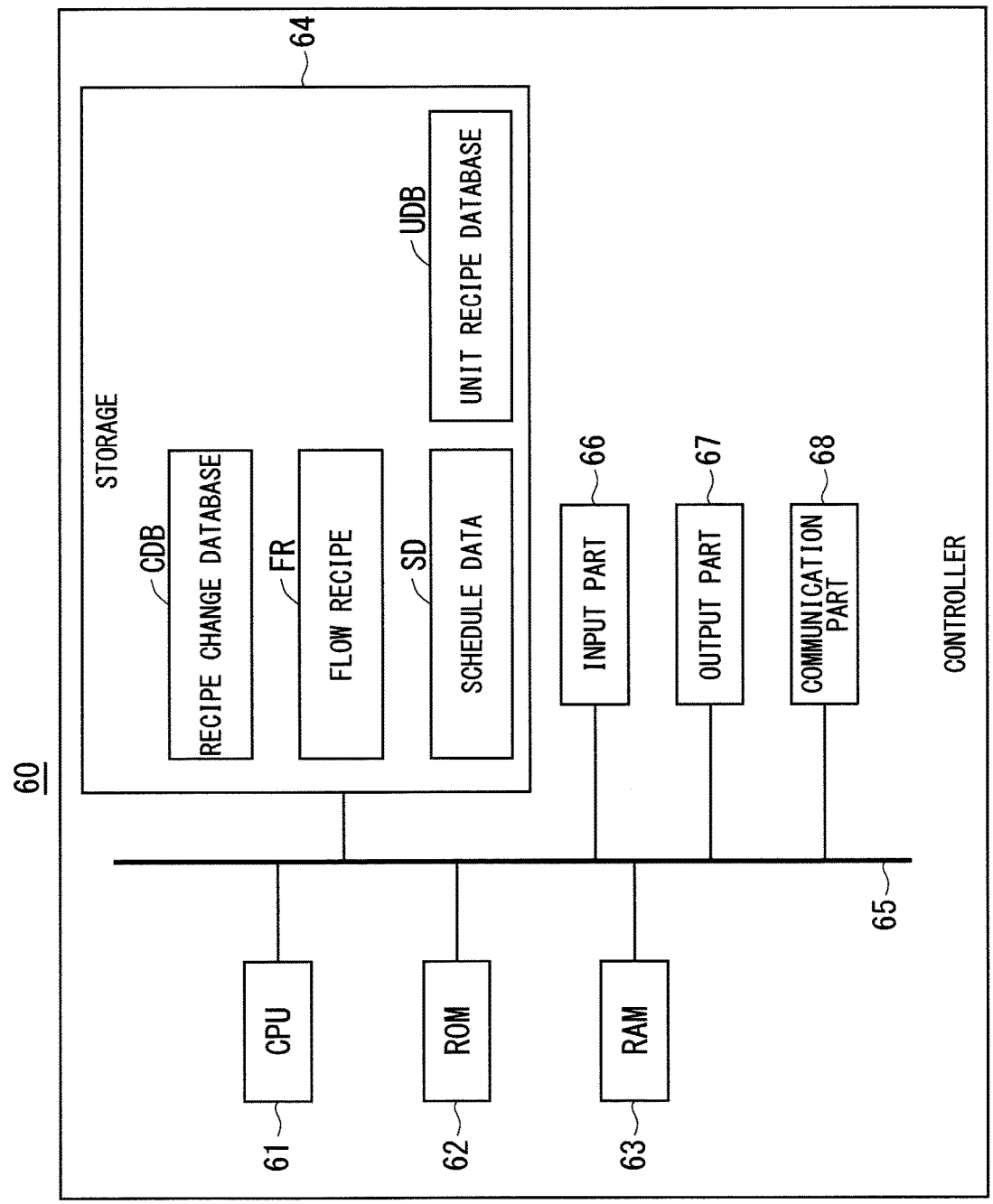
FIG. 11 is a block diagram showing the structure of a controller 60 according to the first embodiment.

FIG. 10 is a block diagram showing an electrical structure of the substrate processing apparatus 1. FIG. 11 is a block diagram showing an internal structure of the controller 60. As shown in FIG. 11, the controller 60 is formed of a general computer including for example a CPU 61, a ROM 62, a RAM 63, and the storage 64 connected to each other through a bus line 65. The ROM 62 stores a basic program, for example. The RAM 63 is provided as a working region for the CPU 61 to perform certain processing. The storage 64 is formed of a nonvolatile storage such as a flash memory or a hard disk drive. The storage 64 stores a recipe change database CDB, the flow recipe FR transmitted from the host computer to the controller 60, schedule data SD (described later) generated based on the flow recipe FR, and the unit recipe database UDB.

As shown in FIG. 10, the controller 60 functionally includes a scheduling part 71, a process executing part 72, and a recipe controller 73. The controller 60 makes the CPU 61 execute a control program stored in advance for example in the ROM 62, thereby making the CPU 61 function as functional parts including the scheduling part 71, the process executing part 72, and the recipe controller 73, while making storage means such as the RAM 63 or the storage 64 function as functional parts including a recipe change database CDB storage, a flow recipe FR storage, a schedule data SD storage, and a unit recipe database UDB storage.

The scheduling part 71 generates schedule data SD about each target substrate W describing a time-series schedule for example in a table format based on the flow recipe FR. The generated schedule data SD is stored in the storage 64.

The process executing part 72 puts various functions of the substrate processing apparatus 1 into operation according to the schedule data SD to execute transport of a target substrate W in the substrate processing apparatus 1, and cleaning process on the target substrate W, preparatory process, post-process, etc. in the processing unit SS (SSR).

The recipe controller 73 monitors transport, cleaning, etc. of a target substrate W by the process executing part 72 and has the function of receiving information such as a processing status from each processor. The recipe controller 73 has the function of determining the occurrence of an event that involves change of the schedule data SD by referring to the recipe change database CDB described later and instructing the scheduling part 71 to change the flow recipe FR and the schedule data SD. The controller 60 further includes the input part 66, an output part 67, and a communication part 68 connected to the bus line 65. The input part 66 is formed of various switches or a touch panel, for example, and accepts instruction from an operator to enter various settings of a processing recipe, for example. The output part 67 is formed of a liquid crystal display and a lamp, for example, and displays information of various types under control by the CPU 61. The communication part 68 has a data communication function achieved through the LAN 65, for example. The controller 60 is connected to control targets including the indexer robot IR, the center robot CR, the IR moving mechanism 5, the CR moving mechanism 17, the front and rear surface cleaning processors 11 and 12, the reversing unit RT1, and the reversing and transferring unit RT2. Description of generation and change of the schedule data SD is given in detail after description of the behavior of the substrate processing apparatus 1.

2. Behavior of Substrate Processing Apparatus 1

The foregoing description relates to the structure of each device in the substrate processing apparatus 1 and the behavior in each device (including cleaning process and reversing process). The following description relates to transfer of a substrate W between each device in the substrate processing apparatus 1 (including substrate placement part PASS, reversing unit RT1, reversing and transferring unit RT2, cleaning unit SS, etc.) and the indexer robot IR or the center robot CR, and substrate process as viewed from the entire substrate processing apparatus 1.

<2.1 Transfer of Substrate W>

As described above, the indexer robot IR and the center robot CR each include a moving mechanism, a circulation mechanism, an up-and-down mechanism, and an advance-and-retreat mechanism. Each of the indexer robot IR and the center robot CR is allowed to make each of its hands access each element inside the substrate processing apparatus 1.

Transfer of a substrate mentioned herein is described below by giving an example of access from the center robot CR to the front surface cleaning unit SS and an example of access from the center robot CR to the intermediary section 50. FIGS. 12A to 12D and 13A to 13D are schematic views showing an example of transfer of a substrate between the center robot CR and the front surface cleaning unit SS. FIGS. 14A to 14C are schematic views showing transfer of a substrate between the center robot CR and PASS (intermediary section 50). To facilitate understanding, only a substrate W, the support member 54 of each of the substrate placement parts PASS1 to PASS4, and the hands 13*b* to 16*b* are illustrated to show the transfer of a substrate in a simplified manner.

[Access to and from Center Robot CR and Processing Unit]

As shown in FIG. 12A, a processed substrate W1 is placed on the spin chuck 111 in the processing unit SS. The slit 116 of the processing unit SS makes sliding motion to open the gate 117. In order for the center robot CR to transport the processed substrate W1 from the front surface cleaning unit SS in this condition, the controller 60 first controls the circulation mechanism 31 to make the hand 13*b* face this front surface cleaning unit SS. At the same time, the controller 60 controls the up-and-down driving mechanism 32 to place the upper surface of the hand 13*b* at a height below the upper surface of the spin chuck 111 and to place the lower surface of the hand 13*b* at a height above the upper surface of the rotation support 114 (see FIG. 12A).

Next, the controller 60 controls the advance-and-retreat driving mechanism 29 to expand the arm 13*a*. This moves the hand 13*b* horizontally to go into the front surface cleaning unit SS. The member passage region at the tip of the hand 13*b* passes through the spin chuck 111 to place the hand 13*b* under the substrate W1 held on the spin chuck 111, as shown in FIG. 12B. The hands 13*b* to 16*b* of this embodiment can be expanded and contracted individually. Thus, only a hand required for incoming and outgoing transport of a substrate (here, hand 13*b*) is allowed to go into the unit case 115 of the processing unit SS (SSR). This can minimize the quantity of particles that might be brought into the unit case 115 with the hands 13*b* to 16*b*. This can also reduce space between the spin chuck 111 and the rotation support 114 to a vertical width of an extent that allows entry of only one of the hands 13*b* to 16*b*.

Next, the controller 60 controls the up-and-down driving mechanism 32 to move up the hand 13*b*. As a result, the substrate W1 on the spin chuck 111 is transferred onto the hand 13*b*, as shown in FIG. 12C. Then, the controller 60 controls the advance-and-retreat driving mechanism 29 to contract the arm 13*a*. This makes the hand 13*b* retreat from the front surface cleaning unit SS, as shown in FIG. 12D. A series of these behaviors described above is to transport one substrate W from any front surface cleaning unit SS with the hand 13*b*. A substrate W can be transported with a different one of the substrate holding hands 14*b* to 16*b* in the same way as in the aforementioned transport of one substrate W by making the up-and-down driving mechanism 32 change the height of a hand so as to satisfy the same condition as that for the aforementioned transport of one substrate W.

Incoming transport of a substrate is described next. The controller 60 controls the up-and-down driving mechanism 32 to move up the arm 15*a* to a height where an unprocessed substrate W2 held on the upper surface of the hand 15*b* is above the spin chuck 111 (FIG. 13A). Next, the controller 60 controls the advance-and-retreat driving mechanism 29 to expand the arm 15*a*. This moves the hand 15*b* horizontally to go into the front surface cleaning unit SS. As shown in FIG. 13B, the substrate W2 held over the hand 15*b* is placed above the spin chuck 111. Next, the controller 60 controls the up-and-down driving mechanism 32 to move down the hand 15*b*. As a result, the substrate W2 on the hand 15*b* is transferred onto the spin chuck 111, as shown in FIG. 13(*c*) 13C. Then, the controller 60 controls the advance-and-retreat driving mechanism 29 to contract the arm 15*a*. This makes the hand 15*b* retreat from the front surface cleaning unit SS, as shown in FIG. 13D.

A series of these behaviors described above is to transport one substrate W to the front surface cleaning unit SS with the hand 15b. One substrate W can be transported to the rear surface cleaning unit SSR in the same way as in the aforementioned transport of one substrate W to the front surface cleaning unit SS.

As shown in FIGS. 13B and 13C, when the hand 15b is moved down, there is a time when the hand 15b overlaps the spin chuck 111 in a side view (as viewed in the horizontal direction). At this time, as a result of the aforementioned shape of the hand 15b like a bifurcated fork, the spin chuck 111 goes inside the substrate holding hand 15b, so that it does not interfere with the hand 15b. Likewise, there is a time when a support pin of the substrate placement part PASS or the reversing unit RT and each hand overlap each other in a side view (as viewed in the horizontal direction) during transfer of a substrate between the support pin and each hand. The pin and the hand mentioned herein are also designed to avoid interference with each other.

[Access from Center Robot CR to Intermediary Section 50]

FIGS. 14A to 14C are schematic views showing an example of how the center robot CR transports two substrates W simultaneously to the substrate placement parts PASS1 and PASS2. For simultaneous transport of two substrates W to the substrate placement parts PASS1 and PASS2, the center robot CR transports the two substrates W to the substrate placement parts PASS1 and PASS2 simultaneously while making each of the hands 13b and 14b hold one substrate W (incoming transport of two substrates).

More specifically, the controller 60 controls the circulation mechanism 31 and the up-and-down driving mechanism 32 to make the hands 13b and 14b face the substrate placement parts PASS1 and PASS2 respectively. At this time, as shown in FIG. 14A, the hands 13b and 14b have moved up or down to respective heights where the two substrates W held on the hands 13b and 14b are placed above the substrate placement parts PASS1 and PASS2 respectively.

As described above, the gap in the vertical direction between an upper position and a lower position where substrates are held by corresponding ones of the substrate placement parts PASS1 to PASS4 placed one above the other is set to be the same as the gap in the vertical direction between the two substrates W held on the hands 13b and 14b of the center robot CR. Thus, by using the up-and-down driving mechanism 32 to place the substrate W held on the hand 13b above the substrate placement part PASS1, the substrate W held on the different hand 14b can also be placed above the substrate placement part PASS2.

Next, the controller 60 controls the advance-and-retreat driving mechanism 29 to expand the arms 13a and 14a simultaneously. This makes the hands 13b and 14b go into the substrate placement parts PASS1 and PASS2 respectively. As a result, as shown in FIG. 14B, the two substrates W held on the hands 13b and 14b are placed above the substrate placement parts PASS1 and PASS2 respectively.

Then, the controller 60 controls the up-and-down driving mechanism 32 to move down the hands 13b and 14b until the two substrates W are supported on PASS1 and PASS2. This places the substrates W simultaneously on the support pins 55 of PASS1 and PASS2 not shown in FIG. 14C, thereby transferring the two substrates W simultaneously from the center robot CR to the substrate placement parts PASS1 and PASS2, as shown in FIG. 14C. Then, the controller 60 controls the advance-and-retreat driving mechanism 29 to contract the arms 13a and 14a simultaneously, so that the hands 13b and 14b retreat from the substrate placement parts PASS3 PASS1 and PASS/I PASS2 respectively (incoming transport of two substrates).

Although not described by referring to the drawings, for simultaneous transport of two unprocessed substrates W from the substrate placement parts PASS3 and PASS4, the center robot CR makes a series of the aforementioned behaviors in the opposite way. Specifically, the hands 15b and 16b are expanded to extend below the substrate placement parts PASS3 and PASS4 respectively. Next, the hands 15b and 16b are moved up and then the arms 15a and 16a are contracted simultaneously. As a result, two substrates W can be transported simultaneously from the substrate placement parts PASS3 and PASS4 with the hands 15b and 16b respectively (outgoing transport of two substrates).

The foregoing description relates to incoming transport of two substrates W and outgoing transport of two substrates W between the center robot CR and PASS. A series of these behaviors is applicable to transfer of substrates between the center robot CR and a different unit. More specifically, the aforementioned incoming transport of two substrates and the aforementioned outgoing transport of two substrates are applicable to transfer of substrates between the center robot CR and the reversing unit RT1, between the indexer robot IR or the center robot CR and the reversing and transferring unit RT2, between the indexer robot IR and the substrate placement parts PASS, and between the indexer robot IR and the carrier C.

Use of a hand of each robot (CR or IR) of this embodiment is determined whether a substrate W to be held on this hand is an unprocessed substrate before subjected to cleaning process or a processed substrate after subjected to the cleaning process. According to the principle of the aforementioned incoming transport and outgoing transport, the hands 7b, 7c, 15b, and 16b prepared for an unprocessed substrate can be used for incoming transport and outgoing transport of a processed substrate W. However, such use of the hand is not intended in this embodiment. This also applies to the hands 6b, 6c, 13b, and 14b prepared for a processed substrate.

If the center robot CR holds a plurality of substrates W, the center robot CR may transport these substrates W one by one to a plurality of cleaning units SS (or SSR). Likewise, the center robot CR may transport substrates W one by one from a plurality of cleaning units SS (or SSR). In either case, in terms of only a relationship between the individual cleaning unit SS (or SSR) and the center robot CR, the center robot CR transports one substrate to and from this cleaning unit SS (SSR). However, in terms of a relationship between the cleaning processor 11 (or 12) as an aggregate of the cleaning units SS (or SSR) and the center robot CR, the center robot CR can be considered to transport two substrates to and from the cleaning processor 11 (or 12). Thus, in this description, like transport of two substrates to (or from) the intermediary section 50 by the center robot CR by making access to the intermediary section 50, sequential transport of a plurality of substrates W to a plurality of cleaning units SS (or SSR) by the center robot CR holding these substrates W or sequential transport of a plurality of substrates W from a plurality of cleaning units SS (or SSR) and movement of these substrates W to a different segment by the center robot CR is described as incoming (or outgoing) transport of two substrates by the center robot CR.

<2.2 Pattern of Substrate Process>

The following describes patterns of substrate process that can be adopted by the substrate processing apparatus 1.

The substrate processing apparatus 1 can perform various substrate processing patterns selectively on a substrate W including "cleaning of only front surface," "cleaning of only rear surface," "cleaning of both surfaces (rear surface first and then front surface)," and "cleaning of both surfaces (front surface first and then rear surface)," for example. According to the pattern "cleaning of only front surface," after a substrate W is transported from the carrier C, the front surface of the substrate W is subjected to cleaning process without being turned over. After the cleaning process, the substrate W is returned to the carrier C without being turned over. According to the pattern "cleaning of only rear surface," after a substrate W is transported from the carrier C, the substrate W is turned over. Then, the rear surface of the substrate W is subjected to cleaning process. After the cleaning process, the substrate W is turned over and is then returned to the carrier C. According to the pattern "cleaning of both surfaces (rear surface first and then front surface)," after a substrate W is transported from the carrier C, the substrate W is turned over. Then, the rear surface of the substrate W is subjected to cleaning process. Next, the substrate W is turned over to point the front surface of the substrate W upward. Then, the front surface of the substrate W is subjected to cleaning process. The substrate W is thereafter returned to the carrier C without being turned over. According to the pattern "cleaning of both surfaces (front surface first and then rear surface)," after a substrate W is transported from the carrier C, the front surface of the substrate W is subjected to cleaning process without being turned over. Next, the substrate W is turned over to point the rear surface of the substrate W upward. Then, the rear surface of the substrate W is subjected to cleaning process. The substrate W is thereafter turned over and is then returned to the carrier C.

As shown in FIG. 15, a series of processing stages from taking out of a substrate W from the carrier C, then performing cleaning process, etc. on the substrate W, and subsequent returning of the substrate W to the carrier C can be divided into a plurality of segments S1 to S13. The segments S1 and S13 correspond to a stage where a substrate W is housed in the carrier C. The segments S2 and S12 correspond to a stage where the substrate W is transported in the indexer zone 2 by the indexer robot IR. The segments S3, S5, S7, and S11 correspond to a stage where the substrate W is housed in the intermediary section 50. The segments S4, S6, S8, and S10 correspond to a stage where the substrate W is transported in the processing zone 3 by the center robot CR. As shown in FIG. 15, a destination of transport of the substrate W in each segment may differ in a manner that depends on the transport pattern of the substrate W.

For example, in the segment S3, in the case of the pattern "cleaning of only front surface" and the pattern "cleaning of both surfaces (front surface first and then rear surface)," a substrate W is transported to any substrate placement part PASS in the intermediary unit 50a. In the case of the pattern "cleaning of only rear surface" and the pattern "cleaning of both surfaces (rear surface first and then front surface)," the substrate W is transported to the reversing and transferring unit RT2. In the segment S5, in the case of the pattern "cleaning of only front surface" and the pattern "cleaning of both surfaces (front surface first and then rear surface)," the substrate W is transported to any of the front surface cleaning units SS1 to SS8. In the case of the pattern "cleaning of only rear surface" and the pattern "cleaning of both surfaces (rear surface first and then front surface)," the substrate W is transported to any of the rear surface cleaning units SSR1 to SSR8. In the segment S7, in the case of the pattern "cleaning of both surfaces (rear surface first and then front surface)" and the pattern "cleaning of both surfaces (front surface first and then rear surface)," the substrate W is transported to the reversing unit RT1. In the segment S9, in the case of the pattern "cleaning of both surfaces (rear surface first and then front surface)," the substrate W is transported to any of the front surface cleaning units SS1 to SS8. Meanwhile, in the case of the pattern "cleaning of both surfaces (front surface first and then rear surface)," the substrate W is transported to any of the rear surface cleaning units SSR1 to SSR8. In the segment S11, in the case of the pattern "cleaning of only front surface" and the pattern "cleaning of both surfaces (rear surface first and then front surface)," the substrate W is transported to any substrate placement part PASS in the intermediary unit 50a. In the case of the pattern "cleaning of only rear surface" and the pattern "cleaning of both surfaces (front surface first and then rear surface)," the substrate is transported to the reversing and transferring unit RT2.

3. Flow Recipe

A data structure of the flow recipe FR is described next by referring to FIGS. 16 and 17. FIGS. 16 and 17 are tables showing data structures of examples (flow recipe FR1 and flow recipe FR2) of the flow recipe FR. As shown in FIGS. 16 and 17, the flow recipe FR contains data items including a first item "step," a second item "processing unit," and a third item "unit recipe."

As described above, an unprocessed substrate W passes through the substrate placement part PASS of the intermediary unit 50a, etc., and is then transported to the processing unit SS (SSR) by the center robot CR. The flow recipe FR includes "processing unit" in the row "Step 1" that is a data item defining a processing unit SS (SSR) to which a substrate W placed for example on the substrate placement part PASS is to be transported first. In each of the examples of the flow recipe FR1 (FIG. 16) and the flow recipe FR (FIG. 17), the item "processing unit" includes SS1 and SS2. This means that a substrate W is to be transported first to either the front surface cleaning unit SS1 or SS2.

Substrates W are prepared in advance in units of lots and placed for example on the substrate placement parts PASS by the indexer robot IR. The center robot CR transports these substrates W to the front surface cleaning unit SS1 or SS2 assigned to the corresponding substrates W according to instruction by the process executing part 72 (see FIG. 10).

The substrate processing apparatus 1 can clean both surfaces of a substrate W. To clean both surfaces of a substrate W, the substrate W is processed while passing through a plurality of processing units (see the third and fourth patterns of FIG. 15). Like in this case, if a target substrate W is to be transported between a plurality of processing units, a destination of transport of the substrate W should be added. In this case, data is added to the flow recipe FR in rows of step of a number corresponding to the number of additional destinations of transport.

The field "unit recipe" is a data item defining process to be performed by the cleaning unit SS (SSR) by assigning a recipe number. As described above, the cleaning unit SS (SSR) can perform preparatory process, substrate process, and post-process. The field of substrate process in the flow recipe FR identifies the substance of substrate process to be performed on a target substrate W by assigning a recipe number. Further, the substance of preparatory process to be performed before a target substrate W is transported to the processing unit SS (SSR) and the substance of post-process to be performed after the substrate W is transported from this unit SS (SSR) are identified by assigning respective recipe numbers. Preparatory process is not to be performed according to the flow recipe FR1 (FIG. 16), so that the field of preparatory process is blank. Preparatory process is to be performed according to the flow recipe FR2 (FIG. 17), so that a recipe number "unit recipe 11" corresponding to a unit recipe of preparatory process to be performed is assigned to the field of preparatory process. Further, a recipe number "unit recipe 1" is assigned to the field of substrate process in the flow recipe FR1, whereas a recipe number "unit recipe 2" is assigned to the field of substrate process in the flow recipe FR2. The field of post-process is blank in each of the flow recipes FR1 and FR2. This shows that post-process is not required to be performed according to the flow recipes FR1 and FR2.

The necessity and the substance of preparatory process depend on the characteristics of a target substrate W and the substance of substrate process to be performed on the substrate W. If substrate process to be performed requires particularly high cleanliness, for example, preparatory process of cleaning the inside of the processing unit SS (SSR) in advance is determined to be necessary.

The necessity and the substance of post-process depend on the substance of substrate process having been performed on a substrate W. If substrate process to be performed uses a high-temperature processing liquid, for example, post-process of cooling the inside of the processing unit SS (SSR) is determined to be necessary after this substrate process.

The recipe change database CDB is described next by referring to FIG. 18. As described above, the recipe change database CDB is a database referred to by the recipe controller 73 when the recipe controller 73 determines the occurrence of an event that involves change of the schedule data SD. Examples of types of the event that involves change of the schedule data SD include: the life status of a processing liquid used in the cleaning unit SS (SSR) (variable V1: processing liquid life); the life status of cleaning of the cleaning unit SS (SSR) (variable V2: chamber life); the status of a member such as the nozzle 113 equipped in the cleaning unit SS (SSR) (variable V3: unit status); the status of a member responsible for substrate transport such as the indexer robot IR or the center robot CR (variable V4: device status); and a history of substrate process in a specific cleaning unit SS (SSR) (variable V5: recipe executing status).

If the occurrence of such an event is determined, the recipe controller 73 changes the flow recipe FR by referring to the recipe change database CDB.

Figure 18:
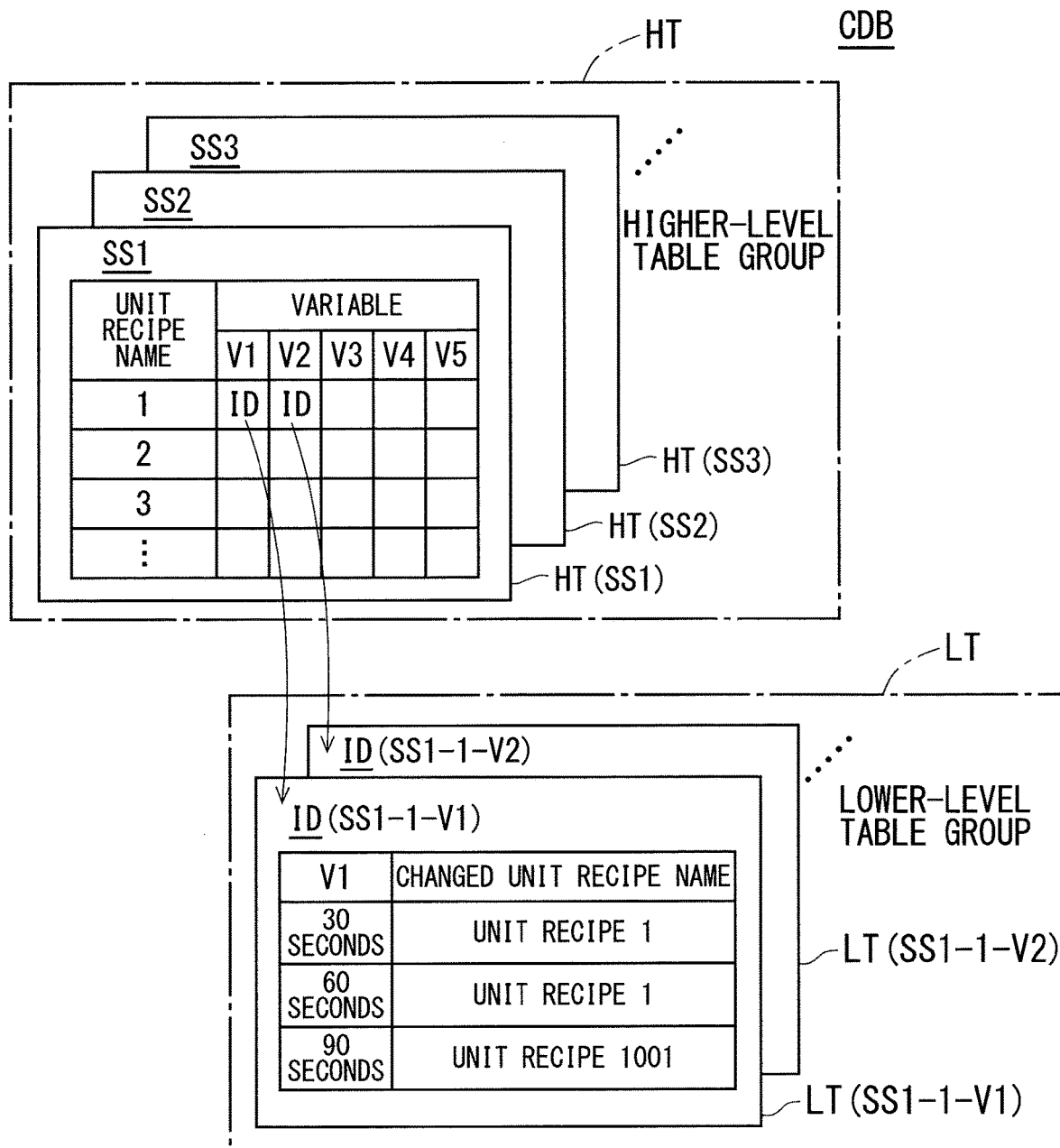
FIG. 18 is a diagram showing a data structure of a recipe change database CDB according to the first embodiment.

As shown in FIG. 18, the recipe change database CDB is a multilevel database including a higher-level table group HT and a lower-level table group LT. Tables including HT (SS1), HT (SS2), HT (SS3), etc. belonging to the higher-level table group HT are prepared for corresponding ones of the plurality of cleaning units SS (SSR). Each record forming the higher-level table HT is provided for a corresponding unit recipe to be executed by the cleaning unit SS (SSR) associated with this table. A data item in each record is associated with a corresponding one of the aforementioned variables V1 to V5. The value of a table identifier ID used for identifying the name of a lower-level table LT is stored in a data item in each record. The recipe controller 73 identifies a lower-level table LT to be referred to using this table identifier ID as a key to search for specific values of the variables V1 to V5.

Each record forming the lower-level table LT is provided for a corresponding specific value of an associated variable V. The specific value of the variable V and the name of a changed unit recipe are associated in a data item in each record.

For example, a lower-level table LT (SS1-1-V1) is a table to be referred to when the unit recipe 1 is executed by the cleaning unit SS1. Each record forming the lower-level table LT (SS1-1-V1) is provided for a corresponding specific value of the variable V1 (life status of a chemical liquid). The life status of the chemical liquid is determined based on the length of time elapsed after generation of the chemical liquid. If 30 seconds have elapsed, meaning that if the elapsed time is relatively short, the activity level of the chemical liquid is not reduced seriously. In this case, a unit recipe is not required to be changed. Thus, "unit recipe 1" is associated with 30 seconds. The activity level of the chemical liquid is reduced with relatively longer elapsed time. This causes a risk in that intended effect cannot be achieved unless processing time is extended. Thus, "unit recipe 1001" different from the unit recipe 1 and involving processing time longer than that of the unit recipe 1 is associated with 90 seconds.

Lower-level tables LT shown in FIGS. 19A to 19D are different exemplary tables to be referred to by the recipe controller 73 when the unit recipe 1 is executed by the cleaning unit SS1.

Each record forming a lower-level table LT (SS1-1-V2) of FIG. 19A is provided for a corresponding specific value of the variable V2 (chamber life). A specific value of the chamber life is determined based on the number of substrates W having been processed by a corresponding cleaning unit SS (SSR) after final cleaning of this cleaning unit SS (SSR). The inside of the cleaning unit SS (SSR) is contaminated after each substrate process is performed. If the number of processed substrates is relatively small (such as 100), however, a level of the contamination is not so serious. In this case, preparatory process is not required to be performed before substrate process is started. For this reason, "unit recipe 1" is associated with the number 100. In response to increase in the number of processed substrates to a relatively large number (such as 300), "unit recipe 1" requiring an environment of relatively high cleanliness may be substituted by a different unit recipe (called a unit recipe 2001) that can be executed under not so high cleanliness. For this reason, "unit recipe 2001" is associated with the number 300. In response to further increase in the number of processed substrates (to a number such as 400), preparatory process should be performed before substrate process. Thus, "preparatory process first and then unit recipe 1" is associated with the number 400.

Each record forming a lower-level table LT (SS1-1-V3) of FIG. 19B is provided for a corresponding specific value of the variable V3 (unit status). A specific value of the unit status means the operating condition of each element (cleaning brush 112, nozzle 113, spin rotation support 114, cup, etc.) in a corresponding cleaning unit SS (SSR). In the lower-level table LT (SS1-1-V3), the substance of change of a unit recipe and the necessity of stopping the unit recipe are determined in advance in consideration of the substance of a target unit recipe and an event to occur. For example, in the absence of abnormality in the cleaning unit SS (SSR), the unit recipe 1 is not required to be changed. For this reason, "unit recipe 1" is associated with an event "no abnormality." Further, the unit recipe 1 is assumed to be intended for substrate process using the nozzle 113. In this case, the occurrence of an error in "nozzle 113" necessitates stop of the unit recipe 1. This may be handled by using a different unit recipe (called a unit recipe 2) not involving use of the nozzle 113 instead of "unit recipe 1" involving use of "nozzle 113." For this reason, "unit recipe 2" is associated with the event "error in nozzle 113." The spin chuck 111 is a member required for executing all unit recipes. Thus, the occurrence of an error in the spin chuck 111 cannot be handled by substituting a unit recipe by a different recipe. For this reason, "not to be processed" is associated with the event "error in spin chuck 111." In this case, a schedule is changed so as to transport a substrate W to be subjected to substrate process by the cleaning unit SS1 to a different cleaning unit SS (SSR).

Each record forming a lower-level table LT (SS1-1-V4) of FIG. 19C is provided for a corresponding specific value of the variable V4 (device status). A specific value of the device status means the operating condition of each functional part (reversing and transferring unit RT2, center robot CR, etc.) in the substrate processing apparatus 1. In the lower-level table LT (SS1-1-V4), the substance of change of a unit recipe and the necessity of stopping the unit recipe are determined in advance in consideration of the substance of a target unit recipe and an event to occur. The unit recipe 1 is assumed to be intended for substrate process of the pattern "cleaning of only rear surface" (see FIG. 15). In this case, for execution of the unit recipe 1, a substrate W is not required to be reversed by the reversing unit RT1. Thus, the occurrence of an event "error in reversing unit RT1" does not require substitution of the unit recipe 1 by a different unit recipe. For this reason, "unit recipe 1" is associated with the event "error in reversing unit RT1."

For execution of the unit recipe 1, a target substrate W should be reversed by the reversing and transferring unit RT2. Thus, the occurrence of abnormality in the reversing and transferring unit RT2 may be handled by substituting the unit recipe 1 by a different unit recipe not involving use of the reversing and transferring unit RT2 in all the cleaning units SS (SSR). For example, a unit recipe of the pattern "cleaning of only front surface" can be executed without using the reversing and transferring unit RT2. Thus, the occurrence of the event "abnormality in reversing and transferring unit RT2" may be handled by substituting the unit recipe 1 by a different unit recipe (called a unit recipe 1002) intended for "cleaning of only front surface." For this reason, "unit recipe 1002" (recipe intended for cleaning of only front surface) is associated with the event "abnormality in reversing and transferring unit RT2."

The occurrence of abnormality in the center robot CR cannot be handled by substitution of a unit recipe. In this case, "not to be processed" is associated with this occurrence.

Each record forming a lower-level table LT (SS1-1-V5) of FIG. 19D is provided for a corresponding specific value of the variable V5 (recipe executing status). A specific value of the recipe executing status means the type of a unit recipe having been executed by a target cleaning unit SS (SSR) immediately before. While different types of substrate processes are to be performed in the same cleaning unit SS (SSR), there arises a combination of types of substrate processes that cannot be performed continuously for example for reason of preventing continuous use of chemical liquids that should be separated from each other. The lower-level table LT (SS1-1-V5) is a data table where the type of a unit recipe to be executed immediately before execution of the unit recipe 1 and the cleaning unit SS1. For example, the unit recipe 1 is assumed to be a unit recipe that can be executed continuously without involving intervention of unit cleaning. In this case, if a unit recipe executed previously is "unit recipe 1," a unit recipe to be executed next is not required to be changed. For this reason, "unit recipe 1" is associated with "unit recipe 1." The unit recipe 2 is assumed to be intended for a type of substrate process to contaminate the inside of the cleaning unit SS (SSR). In this case, preparatory process is desirably performed in this cleaning unit SS (SSR) before substrate process is performed next. For this reason, "preparatory process first and then unit recipe 1" is associated with "unit recipe 2." Further, a chemical liquid to be used according to a unit recipe 3 and a chemical liquid to be used according to the unit recipe 1 form a combination that should be avoided. In this case, the unit recipe 1 cannot be executed immediately after execution of the unit recipe 3. For this reason, "unit recipe 3" is associated with "unit recipe 3" instead of "unit recipe 1." In this case, a substrate W to be originally subjected to process according to the unit recipe 1 by the cleaning unit SS1 is sent to a different cleaning unit SS (SSR). In the cleaning unit SS1, "unit recipe 3" is executed instead of "unit recipe 1".

4. Substrate Process

A flow of substrate process in this embodiment is described next by referring to the flowchart of FIG. 20. First, a job is given from the host computer not shown in the drawings to the controller 60 (step ST1).

The scheduling part 71 reads a flow recipe FR identified by the job from the storage 64 (step ST2). The scheduling part 71 generates schedule data SD (step ST3) based on the read flow recipe FR and the substance of a specific unit recipe identified with a recipe number in the flow recipe FR (as described above, this unit recipe is stored in the unit recipe database UDB in the storage 64). The schedule data SD is data describing the behavior of the substrate processing apparatus 1 in a time-series manner.

The process executing part 72 operates each element of the substrate processing apparatus 1 based on the schedule data SD (step ST4).

The recipe controller 73 monitors the occurrence of an event that involves change of the flow recipe FR by referring to the recipe change database CDB (step ST5). On the occurrence of an event that involves change of the flow recipe FR (if a result of step ST6 is Yes), the recipe controller 73 considers whether the flow recipe FR being executed can be substituted by a different flow recipe FR for an unfinished job (step ST7). If a result of step ST7 is Yes, the recipe controller 73 substitutes the flow recipe FR by a different flow recipe FR (step ST9). At this time, the recipe controller 73 not only changes the substance of substrate process but also adds preparatory process or post-process, where necessary. Meanwhile, if a result of step ST7 is No, substrate process by an identified cleaning unit is stopped (step ST8). Next, the scheduling part 71 changes the schedule data SD based on the substituted flow recipe FR (step ST10). After the schedule data SD is changed, the flow returns to step ST4 and the process executing part 72 controls each part of the substrate processing apparatus 1 based on the changed schedule data SD.

A specific example of change of a substrate processing schedule by the substrate processing apparatus 1 is described next. It is assumed that a job 1 identifying the flow recipe FR1 (FIG. 16) and a job 2 identifying the flow recipe FR2 (FIG. 17) are given from the host computer to the controller 60 in step ST1 of FIG. 20. The controller 60 determines to start the job 1 before the job 2. The scheduling part 71 reads the flow recipe FR1 corresponding to the job 1 from the storage 64 (step ST2 of FIG. 20). Based on the flow recipe FR1, the scheduling part 71 generates schedule data SD such as that shown in the timing diagram of FIG. 21A (step ST3 of FIG. 20).

Specifically, the indexer robot IR takes a substrate W1 and a substrate W2 out of the carrier C and places the substrates W1 and W2 on the substrate placement parts PASS at time t0. At time t1, the center robot CR takes the substrates W1 and W2 out of the substrate placement parts PASS simultaneously. At time t2, the center robot CR transports the substrate W1 to the front surface cleaning unit SS1. From time t2 to time t4, the substrate W1 is subjected to substrate process corresponding to the substance of the unit recipe 1 by the front surface cleaning unit SS1. At time t3, the center robot CR transports the substrate W2 to the front surface cleaning unit SS2. From time t3 to time t5, the substrate W2 is subjected to substrate process corresponding to the substance of the unit recipe 1 by the front surface cleaning unit SS2. At time t4, the center robot CR takes the substrate W1 having been subjected to the substrate process out of the front surface cleaning unit SS1. At time t5, the center robot CR takes the substrate W2 having been subjected to the substrate process out of the front surface cleaning unit SS2. At time t6, the center robot CR places the substrates W1 and W2 on the substrate placement parts PASS simultaneously.

As described above, according to this schedule, substrate processes corresponding to the substance of the unit recipe 1 are performed in parallel by the cleaning units SS1 and SS2.

According to this schedule, a processing cycle from time t0 to time t6 is executed repeatedly. For example, after the processing cycle from time t0 to time t6 is finished, a processing cycle is executed from time t7 to time t13 that is the same as the processing cycle from time t0 to time t6.

Figure 20:
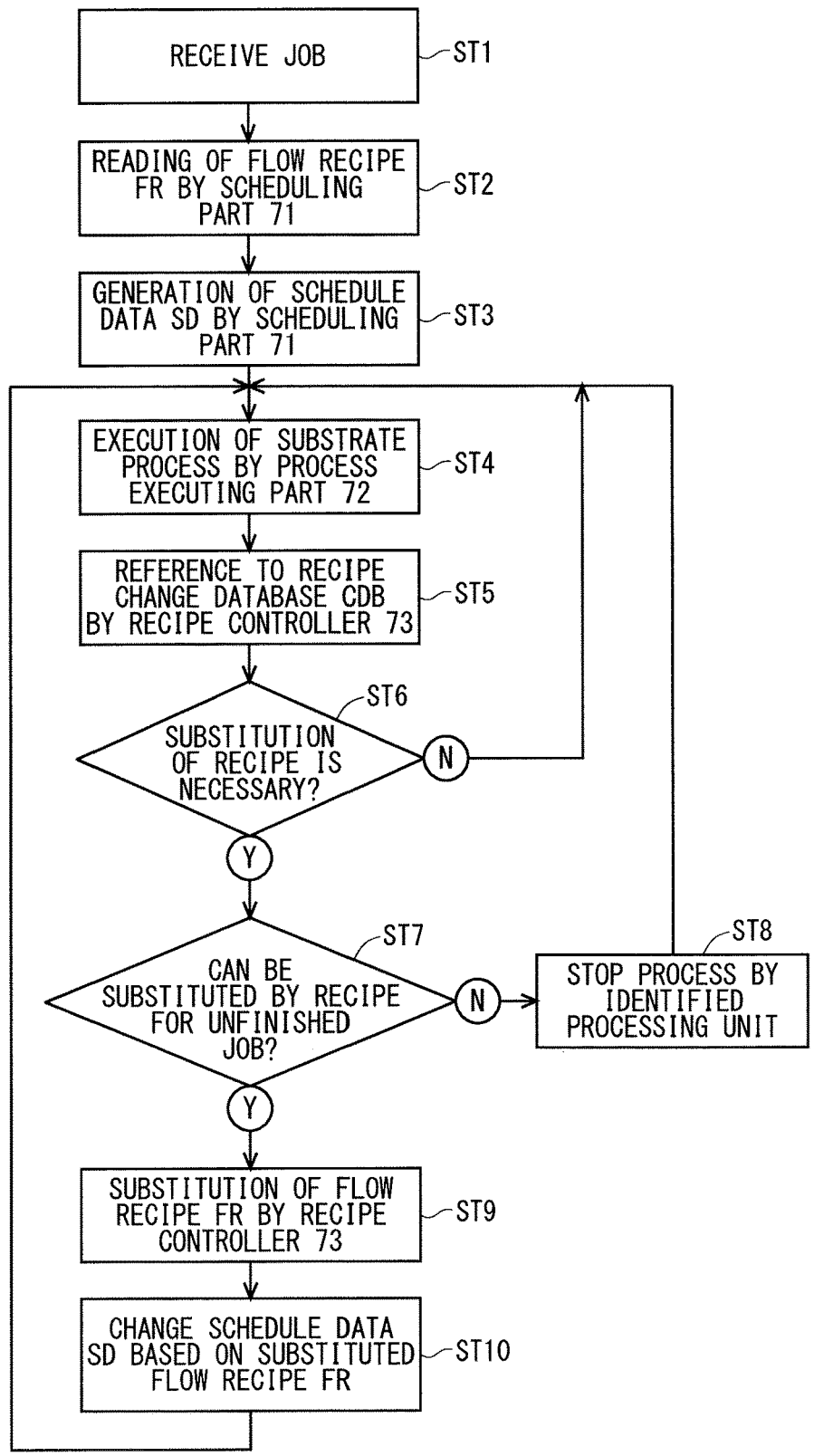
FIG. 20 is a flowchart showing a flow of process of changing a recipe according to the first embodiment.

After the aforementioned schedule data SD is generated in step ST3 of the flow chart of FIG. 20, the process executing part 72 starts substrate process (step ST4).

Figure 21A:
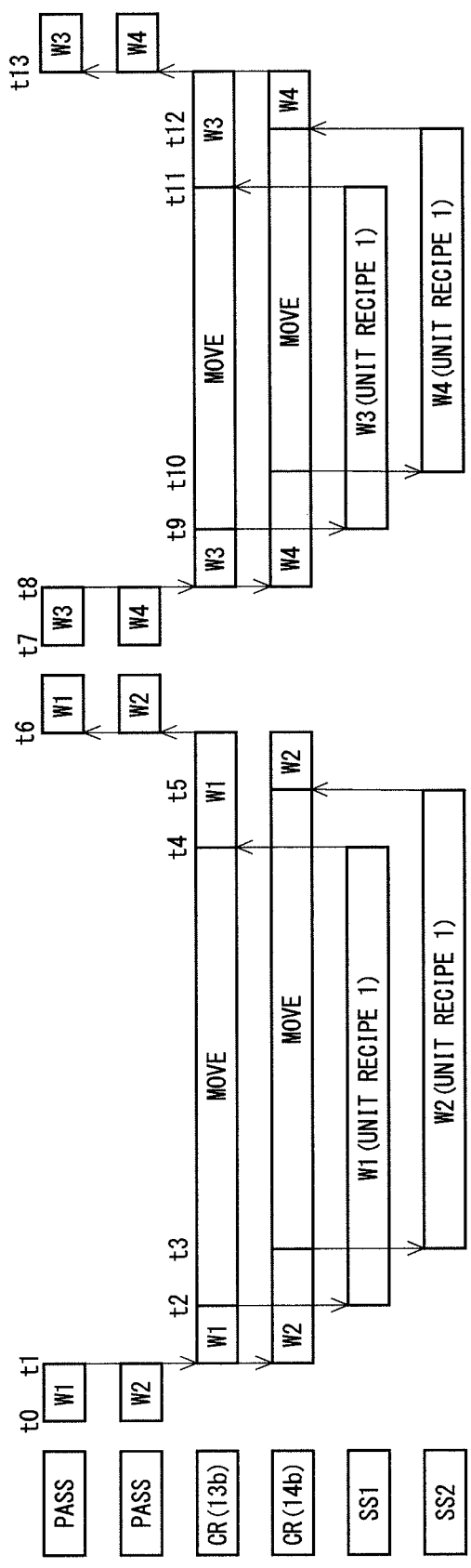
FIG. 21A is a timing diagram showing an exemplary schedule according to the first embodiment.

It is assumed that substrate processes according to the schedule of FIG. 21A are being performed sequentially. In parallel with these processes, the recipe controller 73 collects information from each part of the substrate processing apparatus 1. The recipe controller 73 checks the collected information against the recipe change database CDB to see whether an event that involves change of a flow recipe has occurred (steps ST5 and ST6). If a result of step ST6 is "No," the process executing part 72 performs substrate process. If the number of processed substrates indicative of a chamber life is less than 100, for example, the unit recipe 1 is not required to be changed (see FIG. 19A). In this case, a result of step ST6 is "No."

If a result of step ST6 is "Yes," the flow shifts to step ST7. If an error has occurred in the nozzle 113 during execution of the unit recipe 1, for example, change of the unit recipe 1 is determined to be necessary. Then, the flow shifts to step ST7 (see FIG. 19B). In step ST7, it is determined whether or not a unit recipe for a job being executed by a cleaning unit where a problem has occurred can be substituted by a unit recipe for an unfinished job. Here, it is assumed that an error has occurred in the nozzle 113 in the cleaning unit SS1 immediately before time t4 (see FIG. 21B). As shown in FIG. 19B, the lower-level table SS1-1-V3 determines that the unit recipe 1 can be substituted by "unit recipe 2" in response to the occurrence of the event "error in nozzle 113." Thus, if the job 2 to be executed after the job 1 identifies a flow recipe including the unit recipe 2, the unit recipe 1 being executed can be substituted by the unit recipe 2. The flow recipe FR2 identified by the job 2 includes the unit recipe 2. In this case, a result of step ST7 is "Yes" accordingly. Then, the scheduling part 71 changes a flow recipe to be executed by the cleaning unit SS1 from the flow recipe FR1 (job 1) to the flow recipe FR2 (job 2). Next, the scheduling part 71 changes the schedule data SD in such a manner that after time t4, the flow recipe FR2 is executed by the cleaning unit SS1 and the flow recipe FR1 is executed by the cleaning unit SS2 (step ST10).

Figure 21C:
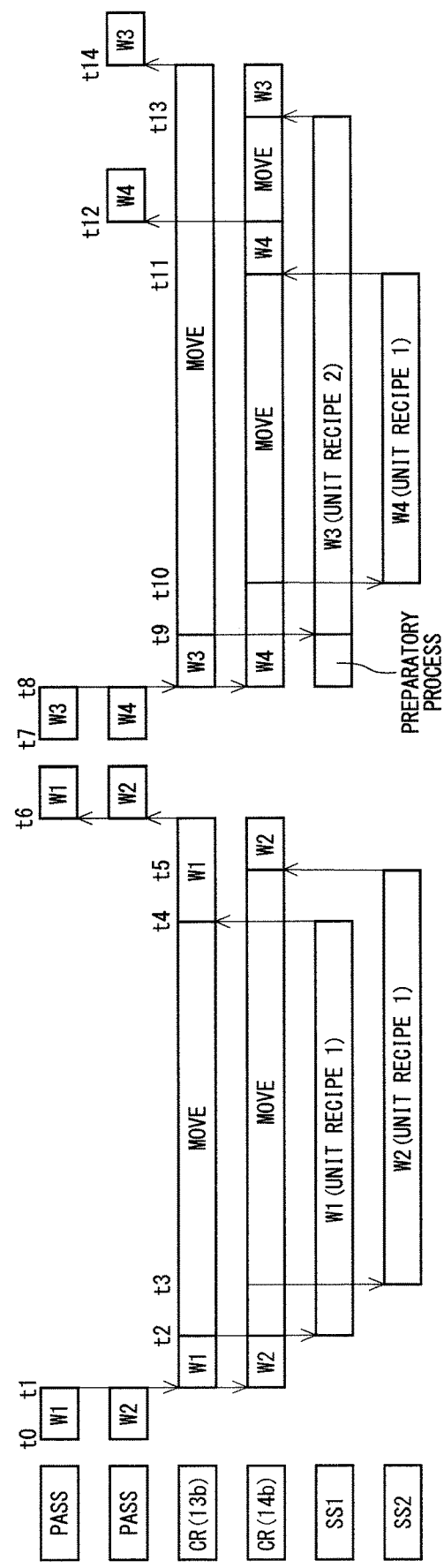
FIG. 21C is a timing diagram showing an exemplary schedule according to the first embodiment.

FIG. 21C shows a schedule resulting from the change in step ST10. The substituted flow recipe FR2 is a recipe according to which preparatory process corresponding to the substance of "unit recipe 11" and substrate process corresponding to the substance of "unit recipe 2" are to be performed sequentially (see FIG. 17). Thus, after time t4, the cleaning unit SS1 performs the preparatory process corresponding to the substance of the unit recipe 11 (from time t8 to time t9) before the substrate process. Next, the cleaning unit SS1 performs the substrate process corresponding to the substance of the unit recipe 2 (from time t9 to time t13).

A substrate transport schedule is changed in response to change of the substance of a unit recipe. The substrate transport schedule is changed so as to transport a substrate identified by the job 2 to the cleaning unit SS1. The unit recipe 2 takes longer processing time than the unit recipe 1. Thus, timing of the finish of the unit recipe 1 by the cleaning unit SS2 (time t11) comes before timing of the finish of the unit recipe 2 by the cleaning unit SS1 (time t13). Thus, a schedule is changed so as to make the center robot CR transport a substrate from the cleaning unit SS2 first (time t11) and then transport a substrate from the cleaning unit SS1 (time t13).

The specific example of schedule change described above is applied to the case where substrate process of a substance corresponding to the unit recipe 1 is planned to be performed by the cleaning unit SS1 and the event "error in nozzle 113" has occurred that involves change of the flow recipe FR1.

This schedule change can also be applied to the occurrence of the event "error in nozzle 113" in a different cleaning unit SS (SSR). This schedule change can also be applied to the occurrence of an event corresponding to a different variable in the cleaning unit SS1. As shown in FIG. 19B, for example, in response to the occurrence of an error in the spin chuck 111, a substrate W originally planned to be subjected to substrate process by the cleaning unit SS1 is transported to a different unit by referring to the lower-level table SS1-1-V3.

In the aforementioned embodiment, a substrate processing schedule is reset in response to a result of detection of the status of a substrate processing unit (more specifically, a result of detection of the occurrence of an error in the nozzle 113). However, this is not the only case. A substrate processing schedule may be reset in response to a result of detection of the status of substrate transporting means (indexer robot IR, center robot CR, etc.).

The substrate processing apparatus of the first embodiment is intended to minimize interruption of process in the substrate processing apparatus by substituting a recipe being executed by a different recipe, where necessary. This increases the operating rate of the apparatus, so that the throughput of the device can be increased.

In the first embodiment, a scrub cleaning apparatus is described as an example of the substrate processing apparatus 1 configured to make a schedule. However, the substrate processing apparatus 1 of the present invention is not limited to a scrub cleaning apparatus but it can be used as various substrate processing apparatuses including a single-wafer substrate cleaning apparatus not using a brush for cleaning, a cooling apparatus and a drying apparatus, for example.

REFERENCE SIGNS LIST

1 Substrate processing apparatus
2 Indexer zone
3 Processing zone (processor)
4 Carrier holding part
11 Front surface cleaning processor
12 Rear surface cleaning processor
60 Controller (schedule making device)
CR Center robot (transporting means)
71 Scheduling part
72 Process executing part
73 Recipe controller
PASS Substrate placement part
RT1 Reversing unit
RT2 Reversing and transferring unit
SS (SS1 to SS8) Front surface cleaning unit (substrate processing unit)
SSR (SSR1 to SSR8) Rear surface cleaning unit (substrate processing unit)

The invention claimed is:

1. A substrate processing method implemented in a substrate processing apparatus including a substrate processing unit for substrate process, the substrate processing method comprising:
   a recipe identifying step of identifying a recipe for substrate process on a substrate in said substrate processing unit;
   a schedule setting step of setting a substrate processing schedule based on said recipe, said substrate processing schedule including substrate process by said substrate processing unit;
   a detecting step of detecting the status of said substrate processing unit in parallel with a substrate process on said substrate according to said substrate processing schedule;
   a substitution necessity determining step of determining the necessity of substituting said recipe by a different recipe based on the status of said substrate processing unit detected as a result of said detecting step and said recipe;
   a substitution possibility determining step of determining whether or not a unit recipe for a job being executed in said substrate processing unit can be substituted by a unit recipe for an unfinished job following said job being executed, and determining whether or not the substituted unit recipe can be executed in said substrate processing unit, if substituting said recipe by a different recipe is determined to be necessary;
   a schedule resetting step of substituting said recipe by a different recipe and resetting said substrate processing schedule based on the substituted recipe if substituting said recipe by a different recipe is determined to be necessary and a positive determination is made in said substitution possibility determination;
   a substrate processing step of performing substrate process on said substrate according to the reset substrate processing schedule in said substrate processing unit, wherein
   in said detecting step, the number of substrates having been processed by said substrate processing unit after final cleaning of said substrate processing unit is detected, and
   in said substitution necessity determining step, the necessity of substituting said recipe by a different recipe is determined based on said number of the processed substrates.

2. The substrate processing method according to claim 1, wherein
   in said detecting step, the status of a nozzle disposed in said unit is detected, and
   in said substitution necessity determining step, the necessity of substituting said recipe by a different recipe is determined based on whether or not said recipe uses said nozzle.

3. The substrate processing method according to claim 1, wherein
   the substrate processing apparatus includes a substrate transporting means for transporting said substrate to said substrate processing unit,
   said substrate processing schedule includes transport of said substrate by said substrate transporting means,
   in said detecting step, the status of said substrate transporting means is detected,
   in said substitution necessity determining step, the necessity of substituting said recipe by a different recipe is determined based on the status of said substrate transporting means detected as a result of said detecting step and said recipe, and
   in said substrate processing step, said substrate is transported and substrate process is performed on said substrate in said substrate processing unit according to the reset substrate processing schedule.

4. A substrate processing apparatus including a substrate processing unit for substrate process, comprising:
   recipe identifying means for identifying a recipe for substrate process on a substrate in said substrate processing unit;
   schedule setting means for setting a substrate processing schedule based on said recipe, said substrate processing schedule including substrate process by said substrate processing unit;
   detecting means for detecting the status of said substrate processing unit in parallel with a substrate process on said substrate according to said substrate processing schedule;
   substitution necessity determining means for determining the necessity of substituting said recipe by a different recipe based on the status of said substrate processing unit detected by said detecting means and said recipe;
   substitution possibility determining means for determining whether or not a unit recipe for a job being executed in said substrate processing unit can be substituted by a unit recipe for an unfinished job following said job being executed, and determining whether or not the substituted unit recipe can be executed in said substrate processing unit, if substituting said recipe by a different recipe is determined to be necessary;
   schedule resetting means for substituting said recipe by a different recipe and resetting said substrate processing schedule based on the substituted recipe if substituting said recipe by a different recipe is determined to be necessary by said substitution necessity determining means and positive determination is made by said substitution possibility determination means; and
   process executing means for performing substrate process on said substrate according to the reset substrate processing schedule in said substrate processing unit, wherein said detecting means detects the number of substrates having been processed by said substrate processing unit after final cleaning of said substrate processing unit, and said substitution necessity determining means determines the necessity of substituting said recipe by a different recipe based on said number of the processed.

5. The substrate processing apparatus according to claim 4, wherein said detecting means detects the status of a nozzle disposed in said unit, and said substitution necessity determining means determines the necessity of substituting said recipe by a different recipe based on whether or not said recipe uses said nozzle.

6. The substrate processing apparatus according to claim 4, further including a substrate transporting means for transporting said substrate to said substrate processing unit, wherein said substrate processing schedule includes transport of said substrate by said substrate transporting means, said detecting means detects the status of said substrate transporting means, said substitution necessity determining means determines the necessity of substituting said recipe by a different recipe based on the status of said substrate transporting means detected by said detecting means and said recipe, and said process executing means transports said substrate and performs substrate process on said substrate in said substrate processing unit according to the reset substrate processing schedule.

7. The substrate processing method according to claim 1, wherein the status of said substrate processing unit comprises at least one of a unit status, a processing liquid life, a chamber life, a device status, and a recipe executing status.

8. A substrate processing method implemented in a substrate processing apparatus including a substrate processing unit for substrate process, the substrate processing method comprising:

a recipe identifying step of identifying a recipe for substrate process on a substrate in said substrate processing unit;

a schedule setting step of setting a substrate processing schedule based on said recipe, said substrate processing schedule including substrate process by said substrate processing unit;

a detecting step of detecting the status of said substrate processing unit in parallel with a substrate process on said substrate according to said substrate processing schedule;

a substitution necessity determining step of determining the necessity of substituting said recipe by a different recipe based on the status of said substrate processing unit detected as a result of said detecting step and said recipe;

a substitution possibility determining step of determining whether or not a unit recipe for a job being executed in said substrate processing unit can be substituted by a unit recipe for an unfinished job following said job being executed, and determining whether or not the substituted unit recipe can be executed in said substrate processing unit, if substituting said recipe by a different recipe is determined to be necessary;

a schedule resetting step of substituting said recipe by a different recipe and resetting said substrate processing schedule based on the substituted recipe if substituting said recipe by a different recipe is determined to be necessary and a positive determination is made in said substitution possibility determination;

a substrate processing step of performing substrate process on said substrate according to the reset substrate processing schedule in said substrate processing unit, wherein the status of said substrate processing unit comprises at least one of a unit status, a processing liquid life, a chamber life, a device status, and a recipe executing status, wherein said substrate processing unit supplies a processing liquid to said substrate, in said substitution necessity determining step, substituting said recipe is determined to be necessary if the time elapsed from generation of said processing liquid becomes longer than a reference value, and in said schedule resetting step, adopting a recipe involving processing time for discharging said processing liquid longer than that of said recipe as said different recipe.

9. A substrate processing method implemented in a substrate processing apparatus including a substrate processing unit for substrate process, the substrate processing method comprising:

a recipe identifying step of identifying a recipe for substrate process on a substrate in said substrate processing unit;

a schedule setting step of setting a substrate processing schedule based on said recipe, said substrate processing schedule including substrate process by said substrate processing unit;

a detecting step of detecting the status of said substrate processing unit in parallel with a substrate process on said substrate according to said substrate processing schedule;

a substitution necessity determining step of determining the necessity of substituting said recipe by a different recipe based on the status of said substrate processing unit detected as a result of said detecting step and said recipe;

a substitution possibility determining step of determining whether or not a unit recipe for a job being executed in said substrate processing unit can be substituted by a unit recipe for an unfinished job following said job being executed, and determining whether or not the substituted unit recipe can be executed in said substrate processing unit, if substituting said recipe by a different recipe is determined to be necessary;

a schedule resetting step of substituting said recipe by a different recipe and resetting said substrate processing schedule based on the substituted recipe if substituting said recipe by a different recipe is determined to be necessary and a positive determination is made in said substitution possibility determination;

a substrate processing step of performing substrate process on said substrate according to the reset substrate processing schedule in said substrate processing unit, wherein the status of said substrate processing unit comprises at least one of a unit status, a processing liquid life, a chamber life, a device status, and a recipe executing status, wherein in said substitution necessity determining step, substituting said recipe is determined to be necessary if the number of processed substrate is larger than a reference value, and substituting said recipe by a recipe involving a required cleanliness standard that is lower than a cleanliness standard of said recipe as said different recipe in said schedule resetting step.

10. A substrate processing method implemented in a substrate processing apparatus including a substrate processing unit for substrate process, the substrate processing method comprising:

a recipe identifying step of identifying a recipe for substrate process on a substrate in said substrate processing unit;

a schedule setting step of setting a substrate processing schedule based on said recipe, said substrate processing schedule including substrate process by said substrate processing unit;

a detecting step of detecting the status of said substrate processing unit in parallel with a substrate process on said substrate according to said substrate processing schedule;

a substitution necessity determining step of determining the necessity of substituting said recipe by a different recipe based on the status of said substrate processing unit detected as a result of said detecting step and said recipe;

a substitution possibility determining step of determining whether or not a unit recipe for a job being executed in said substrate processing unit can be substituted by a unit recipe for an unfinished job following said job being executed, and determining whether or not the substituted unit recipe can be executed in said substrate processing unit, if substituting said recipe by a different recipe is determined to be necessary;

a schedule resetting step of substituting said recipe by a different recipe and resetting said substrate processing schedule based on the substituted recipe if substituting said recipe by a different recipe is determined to be necessary and a positive determination is made in said substitution possibility determination;

a substrate processing step of performing substrate process on said substrate according to the reset substrate processing schedule in said substrate processing unit, wherein the status of said substrate processing unit comprises at least one of a unit status, a processing liquid life, a chamber life, a device status, and a recipe executing status, wherein said substrate processing apparatus includes a reversing unit for reversing a substrate, in said substitution necessity determining step, substituting said recipe is determined to be necessary if a mechanism for reversing a substrate indicates abnormality, and in said schedule resetting step, adopting a recipe defining a process only on one surface of a substrate as said different recipe.

11. A substrate processing method implemented in a substrate processing apparatus including a substrate processing unit for substrate process, the substrate processing method comprising:

a recipe identifying step of identifying a recipe for substrate process on a substrate in said substrate processing unit;

a schedule setting step of setting a substrate processing schedule based on said recipe, said substrate processing schedule including substrate process by said substrate processing unit;

a detecting step of detecting the status of said substrate processing unit in parallel with a substrate process on said substrate according to said substrate processing schedule;

a substitution necessity determining step of determining the necessity of substituting said recipe by a different recipe based on the status of said substrate processing unit detected as a result of said detecting step and said recipe;

a substitution possibility determining step of determining whether or not a unit recipe for a job being executed in said substrate processing unit can be substituted by a unit recipe for an unfinished job following said job being executed, and determining whether or not the substituted unit recipe can be executed in said substrate processing unit, if substituting said recipe by a different recipe is determined to be necessary;

a schedule resetting step of substituting said recipe by a different recipe and resetting said substrate processing schedule based on the substituted recipe if substituting said recipe by a different recipe is determined to be necessary and a positive determination is made in said substitution possibility determination;

a substrate processing step of performing substrate process on said substrate according to the reset substrate processing schedule in said substrate processing unit, wherein the status of said substrate processing unit comprises at least one of a unit status, a processing liquid life, a chamber life, a device status, and a recipe executing status, wherein in said substitution necessity determining step, substituting said recipe is determined to be necessary if a first processing liquid used in a recipe is a processing liquid for which continuous use is prohibited with a second processing liquid to be used in a next recipe, and adopting a recipe using said first liquid as said different recipe in said schedule resetting step.

* * * * *